United States Patent [19]
Morishita

[11] Patent Number: 5,486,704
[45] Date of Patent: Jan. 23, 1996

[54] SEMICONDUCTOR DEVICE AND ELECTRONIC DEVICE BY USE OF THE SEMICONDUCTOR

[75] Inventor: Masakazu Morishita, Atsugi, Japan

[73] Assignee: Canon Kabushiki Kaisha, Tokyo, Japan

[21] Appl. No.: 118,751

[22] Filed: Sep. 10, 1993

Related U.S. Application Data

[62] Division of Ser. No. 780,397, Oct. 23, 1991, Pat. No. 5,272,357, which is a continuation of Ser. No. 619,527, Nov. 29, 1990, abandoned.

[30] Foreign Application Priority Data

Nov. 30, 1989 [JP] Japan ..................................... 1-311550
Feb. 28, 1990 [JP] Japan ..................................... 2-48320
Feb. 28, 1990 [JP] Japan ..................................... 2-48321

[51] Int. Cl.⁶ .................................................. H01L 29/72
[52] U.S. Cl. .................... 257/9; 257/39; 257/104; 257/105; 257/106; 257/321; 257/587; 257/751; 257/754
[58] Field of Search ......................... 257/9, 39, 104–106, 257/321, 587, 751, 754

[56] References Cited

U.S. PATENT DOCUMENTS 5,272,357  12/1993  Morishita ................................. 257/35

*Primary Examiner*—Edward Wojciechowicz
*Attorney, Agent, or Firm*—Fitzpatrick, Cella, Harper & Scinto

[57] ABSTRACT

A semiconductor devive comprises;

a collector region of first conductivity type;

a base region of second conductivity type;

an emitter region of the first conductivity type;

a thin film provided on the emitter region and capable of flowing therein a tunnel current; and a polycrystalline layer laminated on the thin film.

An energy $\Delta\phi_B$ of potential barrier formed at a grain boundary is not less than a heat energy kT at a temperature therein.

10 Claims, 20 Drawing Sheets

SEMICONDUCTOR DEVICE AND ELECTRONIC DEVICE BY USE OF THE SEMICONDUCTOR

This application is a division of application Ser. No. 07/780,397, filed Oct. 23, 1991, now U.S. Pat. No. 5,272,357, which is a continuation of application Ser. No. 07/619,527, filed Nov. 29, 1990, now abandoned.

BACKGROUND OF THE INVENTION

1. Field of the Invention

This invention relates to a semiconductor device and an electronic device by use of said semiconductor device, more particularly to a semiconductor device with a structure of bipolar transistor structure and an electronic device by use of said semiconductor device.

2. Related Background Art

There have been known in the art devices having thin films through which tunnel current flows as the emitter, such as a bipolar transistor (BPT) with an MIS structure, a heterobipolar transistor (HBT) having a micro-crystal (μC) or an amorphous semiconductor as the emitter, etc.

In this case, in the above-mentioned BPT, by utilizing the difference in tunnel probability between electrons and positive holes, the positive holes from the base are impeded by the above-mentioned thin film, thereby effecting reduction of the base current.

However, in the case of the above-mentioned BPT, since the above-mentioned thin film through which tunnel current flows is used, the series resistance of the emitter becomes higher, whereby the reaction is generated between metal and insulation film, whereby reliability may be sometimes lacking. Particularly, since base current leakage occurs in low current region, it is difficult to effect an increase of the current amplification ratio.

More specifically, the above-mentioned BPT with MIS structure of the prior art, for obtaining characteristics for effecting reduction of the above-mentioned base current, will require a necessary minimum thickness of the above-mentioned thin film, whereby the emitter resistance will be increased. On the contrary, if its thickness is too thin, the inhibition ratio of positive holes will be lowered, whereby no reduction of the base current can be effected to lower the current amplification ratio $h_{FE}$.

Further, since a difference occurs in tunnel probability between positive holes and electrons, positive holes sometimes cannot become carriers, and therefore although application to the npn type transistor may be possible, application to the pnp type transistor is difficult.

More specifically, in the case when the difference in transmittance of positive holes and electrons is small, inhibition of positive holes cannot be accomplished. Further, although utilization of such difference in transmittance may be applicable to an npn type transistor, it is not applicable to a pnp transistor which is different in junction type. The tunnel probability between positive holes and electrons is determined by the tunnel film, the thickness is sensitively reflected on the current amplification ratio $h_{FE}$, whereby variance will readily occur between individual transistors. Further, series resistance may vary similarly in some cases.

On the other hand, in HBT having a micro-crystal (μC) of the prior art, the emitter-base junction, namely the interface between the emitter by use of μC—Si and the base is unstable, and in the low current region of base current, particularly recombination becomes prevailing, whereby the current amplification ration $h_{FE}$ will be sometimes markedly lowered.

In the case of HBT having an μC or HBT having an amorphous semiconductor as mentioned above, both are weak to heat treatment, thus sometimes lacking stability. Further, there sometimes are problems such that the reaction between μC or amorphous semiconductor and Si single crystal interface occurs, that the context of hydrogen is high to cause an elimination phenomenon of said hydrogen to make the process unstable, or that deterioration may occur during actuation.

More specifically, in μC—Si of the prior art, addition of heat treatment will result in reduction of current amplification ratio $h_{FE}$ even at, for example, 450° C. Preparation temperature of μC—Si is generally in the range of 300° to 400° C. Such reduction may be considered to be caused particularly by lowering in band gap and elimination of H (hydrogen) contained in μC—Si, etc. because of increased particle size of μC—Si at the Si interface. In μC—Si of the prior art, a large amount of hydrogen is contained during preparation thereof, and also μC—SiO is stabilized by the presence of hydrogen. The surrounding of μC—Si may be considered to be terminated with hydrogen.

In addition, interface defects may sometimes appear, because base current may be leaked in the low current region, or hetero-junctions are present at the pn junction interface.

The BPT with an MIS structure having the above-mentioned structure of the prior art has a lower current amplification ratio $h_{FE}(=I_C/I_B)$ on the lower current side until, in an extreme case, it become 1 or less, particularly because the recombination current in the oxide film is predominant in the low current region to increase the base current. In the case of such a structure, the reaction between the metal and the insulation film is liable to occur, whereby reliability may be sometimes lacking. Further, since the insulation film has a considerable thickness, the series resistance has become large. Since the tunnel probability between positive holes and electrons is determined according to the thickness of the oxide film, the thickness is sensitively reflected on the above-mentioned $h_{FE}$, whereby characteristic variance of individual BPT occurs. The series resistance will also vary similarly. Thus, difficulties are accompanied with stable preparation of all the oxide films at A order.

On the other hand, in the HBT by use of μC of the prior art, as described above, the emitter-base junction, namely the interface between the emitter and the base use of μC—Si is unstable to heat treatment and susceptible to change, whereby stable preparation can be done with difficulty. This is because it is based on instability of the μC itself or instability at the interface with the single crystalline silicon, and further containment of a large amount of hydrogen in ordinary μC which further promotes instability of the crystal. In addition, one by use of μC is susceptible to characteristic deterioration not only during preparation steps but also during actuation.

SUMMARY OF THE INVENTION

An object of the present invention, in view of the above-mentioned state of the art as described above, is to provide a semiconductor device which can maintain a high current amplification ratio over a broad region of collector current, can withstand heat treatment, and has solved the various problems at the single crystal interface of the prior art, etc., and an electronic device as its application example.

Another object of the present invention, in view of the state of the art as described above, is to provide a semiconductor device which can inhibit increase of base current in low current region., can maintain a high current amplification ratio over a broad region of collector current, has been made applicable to junction transistors of all the types of npn and pnp, etc., and an electronic device as its application example.

Still another object of the present invention, in view of the state of the art as described above, is to provide a semiconductor device which can ensure a high current amplification ratio over broad range of collector current, little in variance of characteristics, can withstand heat treatment, and is applicable to junction transistors of all the types of npn and pnp, etc., and an electronic device as its application example.

An object of the present invention is to provide a semiconductor device comprising:

a collector region of a first conductivity type;

a base region of a second conductivity type;

an emitter region of the first conductivity type;

a thin film provided on said emitter region and capable of flowing therein a tunnel current; and a polycrystalline layer laminated on said thin film, wherein an energy $\Delta\phi_B$ of a potential barrier formed at a grain boundary is not less than a heat energy kT at a temperature therein.

A further object of the present invention is to provide a semiconductor device comprising:

a collector region of a first conductivity type;

a base region of a second conductivity type;

an emitter region of the first conductivity type;

a thin film provided on said emitter region and capable of flowing tunnel current for both carriers of electron and hole; and a polycrystalline laminated on said thin film;

wherein said polycrystalline layer produces a barrier due to a difference between a Fermi level thereof and a Fermi level of said emitter region against a carrier injected from said base region.

A still further object of the present invention is to provide a semiconductor device comprising:

a collector region of a first conductivity;

a base region of a second conductivity;

an emitter region of the first conductivity;

a very thin film formed on said emitter region and capable of following therein tunnel current; and a polycrystalline layer of the first conductivity type laminated on said very thin film;

wherein an electric barrier is formed between said polycrystalline layer and said emitter region, and a height of the barrier is not less than a heat energy therein.

DETAILED DESCRIPTION OF THE PREFERRED EMBODIMENTS

Figure 1:
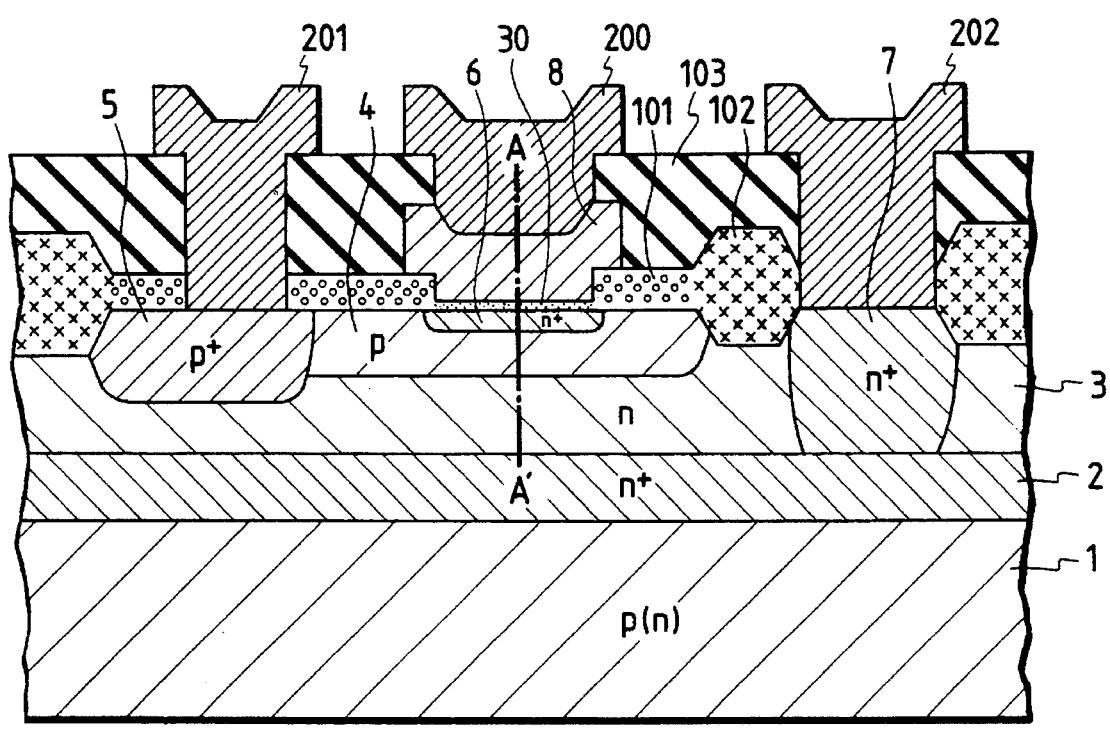
FIG. 1 is a cross-sectional view of a semiconductor device showing the first embodiment of the present invention.

The present invention can effect reduction of base current in a fine current region to obtain high current amplification ratio by preparing a thin film on the n+ emitter region and further laminating a polycrystalline layer thereon, whereby the polycrystalline layer will function as the barrier against positive holes.

By preparing the emitter-base junction in the single crystal, the base current can be reduced in the current region to obtain high current application ratio.

The thickness of the thin film prepared on the $n^+$ emitter region should be preferably made 50 [Å] or less. Film thickness may be desirably as thin as possible. This is because, with a thinner film thickness, the series resistance in the emitter can be lowered, whereby positive holes can also give rise to tunnel phenomenon similarly as electrons.

By formation of a thin film which gives rise to the tunnel phenomena of both positive holes and electrons on the emitter region, the series resistance in the emitter region is lowered.

By formation of a polycrystalline layer on the thin film, a barrier acting on both positive holes and electrons is formed, whereby reduction of base current can be effected.

Further, when the emitter-base junction is formed in the single crystal, an increase of base current in low current region can be inhibited.

In addition, by formation of a ultra-thin film on the emitter region, the tunnel probabilities of both positive holes and electrons become equal to each other, resulting in an increase of current amplification ratio.

By formation of a polycrystalline layer with a high concentration on the ultra-thin film on the emitter region, a barrier of minority carriers injected from the base region is formed, which can contribute to reduction of base current to realize an increase of the current amplification ratio.

Further, since a polycrystal is formed through a ultra-thin film on the single crystal, it is more able to withstand heat as compared with the case when formed directly on the single crystal, and the grain size becomes constant to give also a stable interface.

By formation of an ultra-thin film, positive holes and electrons can be sufficiently tunneled, and therefore current and voltage characteristics of BPT are not affected by the oxide film.

More specifically, since the collector current is determined only by the base, and the value of the base current can be determined by the emitter concentration and depth under the tunnel film, no change of $h_{FE}$ of BPT will occur depending on the thickness of the tunnel film.

In other words, a BPT with little variance having stable $h_{FE}$ can be obtained.

When an emitter-base junction is prepared in the single crystal, an increase of the base current in the fine current region can be inhibited.

Referring now to the drawings, preferred specific embodiments of the present invention are described in detail.

FIG. 2 shows the first embodiment according to the semiconductor device of the present invention.

In the same Figure, reference numeral 1 is a silicon substrate. The substrate 1 is an n-type substrate which has been made n-type by doping of an impurity such as phosphorus (P), arsenic (As), antimony (Sb), etc. or a p-type substrate which has been made p-type by doping of an impurity such as boron (B), aluminum (Al), gallium (Ga), etc.

Reference numeral 2 is an $n^+$ region ($n^+$ embedded region). The $n^+$ embedded region 2 may preferably have the impurity concentration of $10^{16}$ to $10^{20}$ [cm$^{-3}$].

Reference numeral 3 is an n region as a part of the collector region having a low impurity concentration (e.g. about $10^{13}$ to $5 \times 10^{17}$ [cm$^{-3}$]) formed by an epitaxial technique, etc.

Reference numeral 4 is a p-type base region preferably having an impurity concentration of $10^{15}$ to $10^{20}$ [cm$^{-3}$].

Reference numeral 5 is a $p^+$ region for lowering the base resistance and may be preferably have an impurity concentration of $10^{17}$ to $10^{20}$ [cm$^{-3}$].

Reference numeral 6 is a first $n^+$ emitter region.

Reference numeral 7 is a second $n^+$ region. The second $n^+$ region is provided for connecting the collector electrode 202 as described below to the above-mentioned embedded region 2 which is the $n^+$ region so as to lower the collector resistance.

Reference numeral 8 is a polycrystalline layer which is a semiconductor material layer. The polycrystalline layer 8 impedes the carriers injected from the base.

Reference numeral 30 is a thin film. The thin film 30 is provided for fighting the flow of tunnel current.

Reference numerals 101, 102, and 103 are insulating films for providing separation between the electrodes, elements and writings.

Reference numerals 200, 201, and 202 are an emitter electrode, a base electrode and a collector electrode, respectively and the respective electrodes 200, 201 and 202 comprise metals, silicides, etc.

The above-mentioned thin film 30 is made thinner than the film of the MIS type BPT of the prior art. At least positive holes will become the carriers of current. The positive holes passed through said thin film 30 are impeded by the polycrystalline layer 8.

In the following, the above-mentioned polycrystalline layer 8 is described.

Polycrystal is a mass of single crystals having a distribution of a certain size, and those crystals have grains with no constant crystal direction. They have also crystal grain boundaries, and remarkable disorders of lattices occur at those portions. Therefore, the presence of a crystal grain boundary results in electrical characteristics from a single crystal.

The above-mentioned electrical characteristics are greatly influenced by the crystal grain size and the lattice defect density of the crystal grain boundary. The lattice defect existing at the crystal grain boundary becomes the capturing center of free carriers as deep acceptor or doner level to capture charges in a forbidden gap. By such capturing, a depleted layer region arises around the crystal grain boundary to change the potential, and the change of the potential will act like a barrier against the carriers.

Polycrystalline is changed in its characteristics depending on its grain size L [cm], the impurity concentration Ni [cm$^{-3}$], and the trap level density Qt at the crystal grain boundary [cm$^{-2}$]. Referring to the polycrystalline silicon as an example the characteristic change is described below.

Figure 2A:
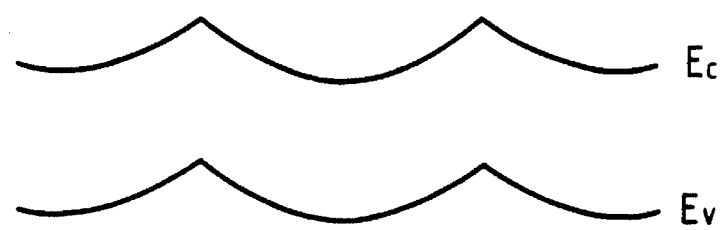
FIG. 2A is a diagram showing the energy level of the polycrystalline layer when $Q_r > L \cdot Ni$.
Figure 2B:
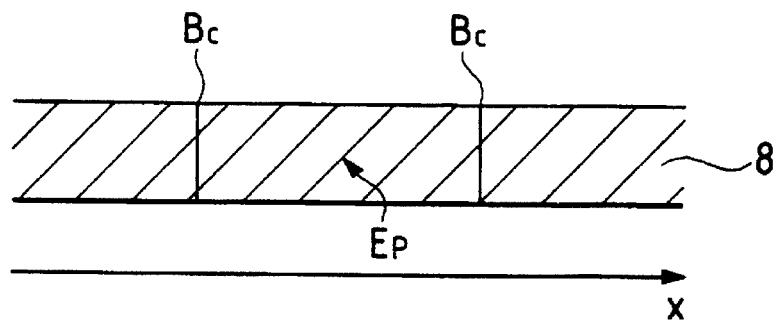
FIG. 2B is a diagram showing distributions of crystal grain boundary $B_C$, depleted layer $E_P$ in a thin film n-type polycrystalline silicon.

FIGS. 2A, 2B show the energy band diagram when $Q_t >$ L·Ni (FIG. 2A), spreading of the crystal grain boundary $B_c$, and the depletion layer $E_P$ in the thin film N-type polycrystalline silicon (FIG. 2B).

Figure 3A:
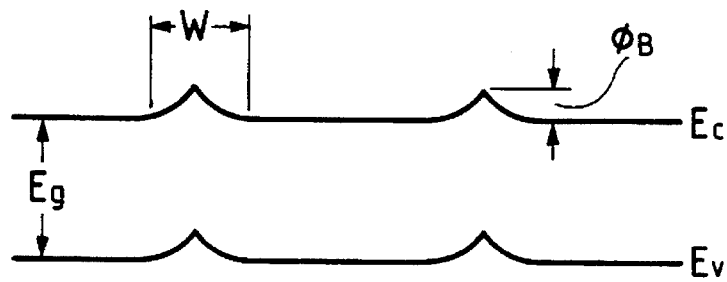
FIG. 3A is a diagram showing the energy level of the polycrystalline layer when $Q_r > L \cdot Ni$.
Figure 3B:
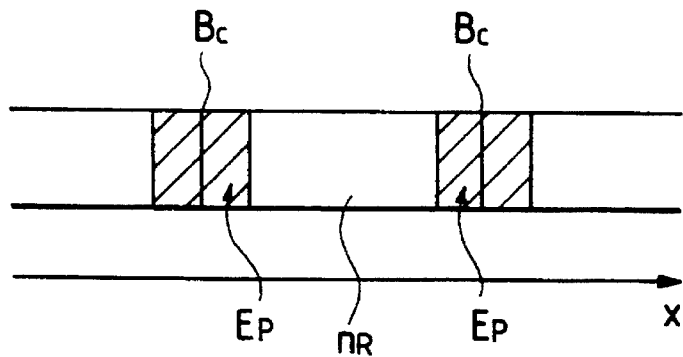
FIG. 3B is a diagram showing distributions of crystal grain boundary $B_C$, depleted layer $E_P$ in a thin film N-type polycrystalline silicon.

FIGS. 3A, 3B show the energy band diagram when $Q_t <$ L·Ni (FIG. 3A), spreading of the crystal grain boundary $B_C$, and the depletion layer $E_P$ in the thin film N-type polycrystalline silicon (FIG. 3B).

More specifically, as shown in FIG. 2B, when $Q_t >$L·Ni, the polycrystalline silicon is internally all depleted. On the other hand, as shown in FIG. 3B, when $Q_t <$L·Ni, the depletion layer region spreads only in the vicinity of the crystal grain boundary, thus representing the state wherein a neutral region remains in the polycrystalline silicon. In other words, resistance will be extremely higher when $Q_t >$L·Ni.

Figure 4:
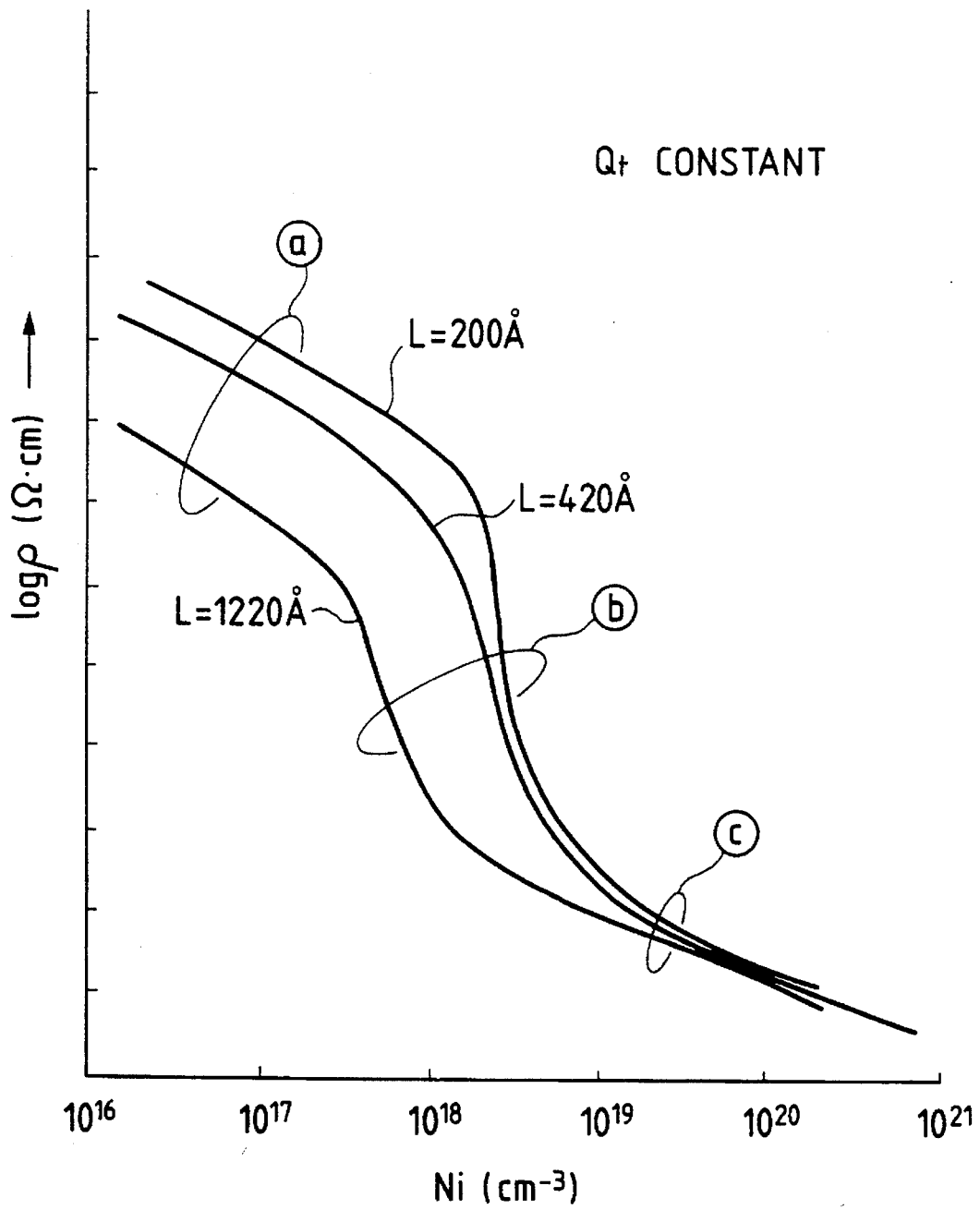
FIG. 4 is a graph showing the relationship of specific resistance versus impurity concentration of polycrystalline layer.

FIG. 4 shows an example of specific resistance ρ versus impurity concentration Ni in the case when the trap level density $Q_t$ is kept constant, and the grain size L is varied as 200 Å, 420 Å, 1220 Å.

Here, the region (a) represents the case of $Q_t >$L·Ni and the region (b) the case of $Q_t <$L·Ni.

The region (c) is the case when the impurity concentration is high and the barrier $\phi_B$ shown in FIG. 3A becomes extremely thin. Because the carriers pass through the barrier by tunnel phenomenon, there is substantially no barrier, whereby the region will have a specific resistance approximate to a single crystal.

The above-mentioned regions (a) and (b) are specific characteristic regions of a polycrystal body, but the region (a) has too high of a resistance and is not suitable for a semiconductor device.

In the present embodiment, it is desirable to use the polycrystal body of the above-mentioned region (b) for the emitter region of the BPT.

Figure 5:
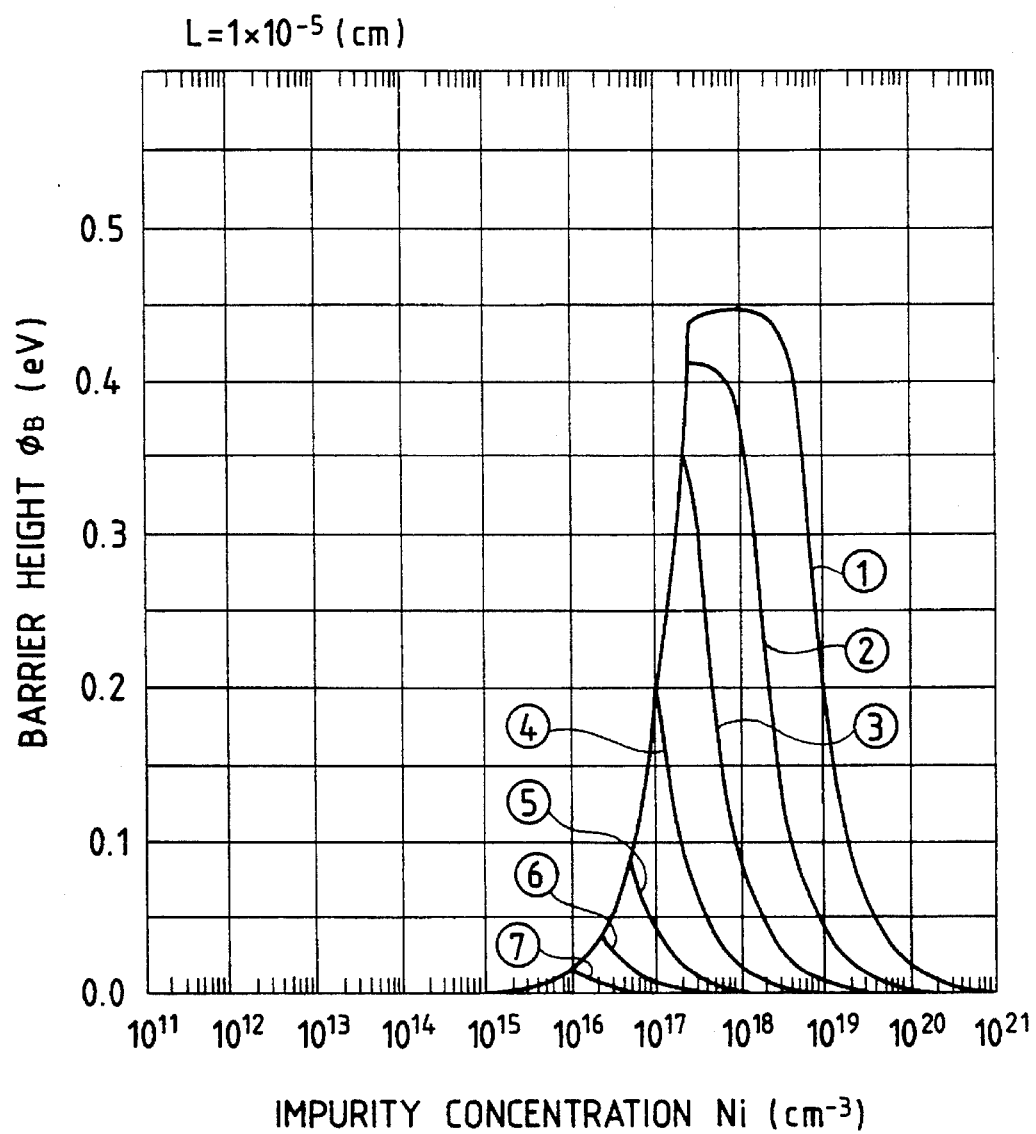
FIG. 5 is a graph showing the relationship of height of potential barrier versus impurity concentration of polycrystalline layer.

It is difficult to measure actually how high is the barrier in the above-mentioned (b), and therefore, as shown in FIG. 5, an example determined by calculation is shown.

That is, with the crystal grain size being made constant as L=10$^{-5}$ [cm], and the respective values of the trap level density $Q_t$ (the respective values corresponding to (1) to (7) in FIG. 5 of 1×10$^{-13}$, 5×10$^{-12}$, 2×10$^{-12}$, 1×10$^{-12}$, 5×10$^{-11}$, 2×10$^{-11}$, 1×10$^{-11}$) being respectively as parameters, the height $\phi_B$ of the above-mentioned barrier is plotted versus impurity concentration Ni [cm$^{-3}$].

According to the experimental data, the $Q_t$ of the polycrystal according to the present invention has a value of about 1×10$^{-12}$, 1×10$^{-13}$ [cm$^{-3}$], while the grain size of ordinary crystal is 200 to 1000 [Å], and therefore the height of the barrier $\phi_B$ may be considered to have ordinarily a value as shown in FIG. 5. Therefore, the maximum value of the height of the barrier $\phi_B$ may be sometimes about 0.45 [eV]. However, it is required that the grain size L, the trap level density $Q_t$ at the interface, the impurity concentration Ni should be optimized.

The current flowing through the region (b) of the polycrystal becomes a heat electron radiation type as one with the carriers flowing over the barrier $\phi_B$.

On the other hand, the width W of the depletion layer $E_P$ (see FIG. 3A) is represented approximately by:

$$W = \frac{Qt}{Ni} \qquad (1)$$

For example, if $Q_t$=5×10$^{-12}$ [cm$^{-2}$] and Ni is 10$^{18}$ [cm$^{-3}$], $$\begin{aligned} W &= 5 \times 10^{-6} \text{ [cm]} \\ &= 500 \text{ [Å]}, \end{aligned}$$

and $\phi_B$ of about 0.35 [eV] will occur. As shown in FIG. 3, if L=1000 [Å], the neutral region $n_R$ of 500 [Å] would remain.

Figure 6:
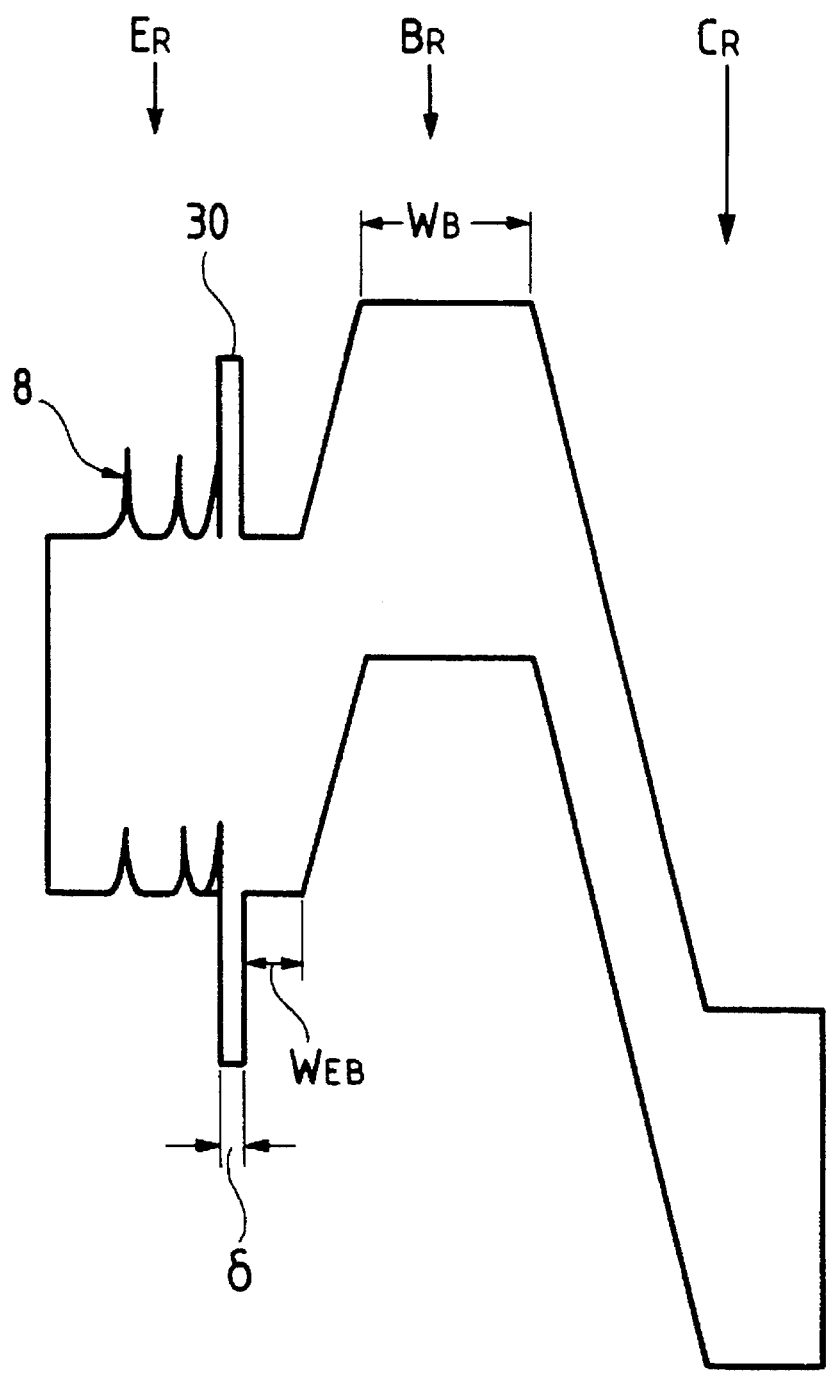
FIG. 6 is a diagram showing the potential along the line A—A' in FIG. 1.

FIG. 6 shows the potential diagram at the cross-section A—A' in FIG. 1. In the same Figure, $E_R$ represents emitter region, $B_R$ base region and $C_R$ collector region.

In the Figure, $W_B$ represents the neutral region width of the base, $W_{EB}$ the neutral region width of the emitter in the single crystal, and δ the thickness of the above-mentioned thin film 30.

The greatest characteristic function of the above-mentioned thin film 30 is to separate the polycrystalline layer 8 from the first n$^+$ region 6 which is the single crystal in the emitter region 6, simultaneously with flattening of its interface, and also stabilizing the polycrystal layer 8.

Figure 7A:
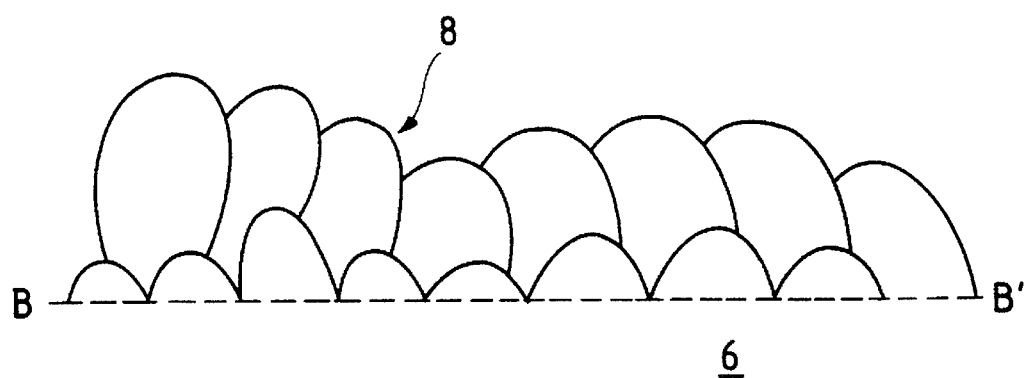
FIG. 7A is a schematic view for illustration of the polycrystalline interface in the structure of the prior art.

More specifically, for example, if the polycrystal layer 8 is deposited directly on the n$^+$ region 6 which is merely a single crystal with the structure of the prior art as shown in FIG. 7A, the crystal having approximately the grain size of a polycrystal is grown epitaxially on the single crystal, whereby the inherent interface with the single crystal (B—B' in FIG. 7A) is changed to become wavy and cannot maintain always a constant shape. In this case, if a polycrystal is deposited on a naturally oxidized film and subjected to heat treatment, the oxide film may be sometimes broken and epitaxial growth may locally occur. In an extreme case, the naturally oxidized film will become shaped like a ball, and the polycrystal recrystallized into single crystal.

Thus, in the case of the structure of the prior art, none of the interfaces between single crystal and polycrystal is flat, thereby causing variance of characteristics of BPT to occur.

More specifically, when the carriers injected from the base into the emitter are recombined in the emitter, the emitter will become internally nonuniform, and therefore in the individual BPT prepared, the base current value is not constant, but variance will become greater between the respective BPT.

Figure 7B:
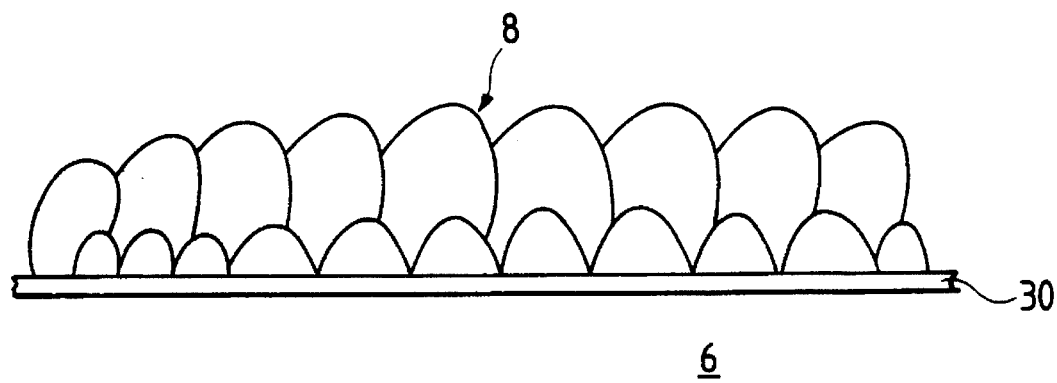
FIG. 7B is a schematic view for illustration of the polycrystalline interface in the structure of the present invention.

In the present invention, as shown in FIG. 7B, the thin film 30 is prepared on the first n$^+$ region 6 which is a single crystal, the polycrystal layer 8 is formed on the thin film (silicon oxide film in the present embodiment), and therefore its interface is flat on the atomic order. The polycrystal layer 8 is deposited through the stable thin film 30, and therefore rearrangement of the polycrystal by heat treatment will not readily occur, and it is also stable in the later heat treatment. In micro-crystal Si, amorphous Si, etc. of the prior art (deposition temperature 100° to 300° C.), the characteristics change easily by heat treatment at 400° to 600° C., whereby deterioration of current amplification ratio $h_{FE}$ will readily occur.

In the present invention, because the crystal is a polycrystal, its deposition temperature is higher, for example, about 550° to 650[°C.]in the case of polycrystalline Si, and therefore in addition to greater crystal grain size, substantially no hydrogen is contained, with the crystal size in the later steps being little, and yet substantially without change by elimination of hydrogen. In the case of polycrystalline Si, it can sufficiently withstand a temperature up to about 900 [°C.] and an extremely stable BPT can be obtained.

The interface of the polycrystal layer 8 exists at the interface with the thin film 30, and therefore the interface with the emitter region which is a single crystal becomes extremely flat. This is an extremely important factor for stabilizing the BPT characteristics.

As is apparent from the above description, the material of the above-mentioned thin film 30 is required to be stable, and may be desirably chemically stable materials such as $SiO_2$, $Si_3N_4$, SiC, $Al_2O_3$, etc. Further, the interface between the thin film 30 and the single crystal is also extremely important, and the recombination level at the interface is required to be low.

As shown in FIG. 6, within the polycrystal layer 8, a convex potential barrier against electrons is formed. On the other hand, a concave potential barrier is formed against positive holes.

Figure 8A:
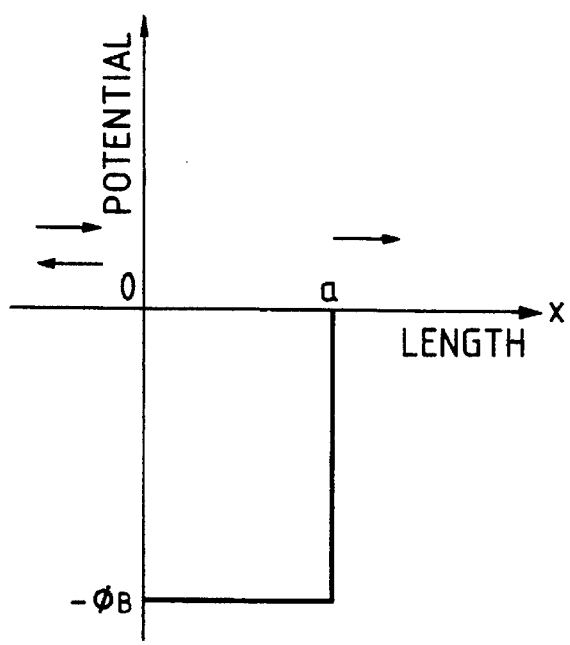
FIG. 8A is an illustrative diagram showing the relationship between potential and distance for illustration of the tunnel film.

As shown in FIG. 8A, when the depth of potential well is defined as $-\phi_B$, and the width as a, the transmission probability $T_{th}$ of the carriers is:

$$T_{th} = \left[ 1 + \frac{\phi_{Bh}^2 \sin^2 \alpha a}{4E(E+\phi_B)} \right]^{-1} \tag{2}$$

where $$\alpha = \left[ \frac{2m^*(\phi_{Bh}+E)}{\hbar^2} \right]^{1/2} \tag{4}$$

Figure 8B:
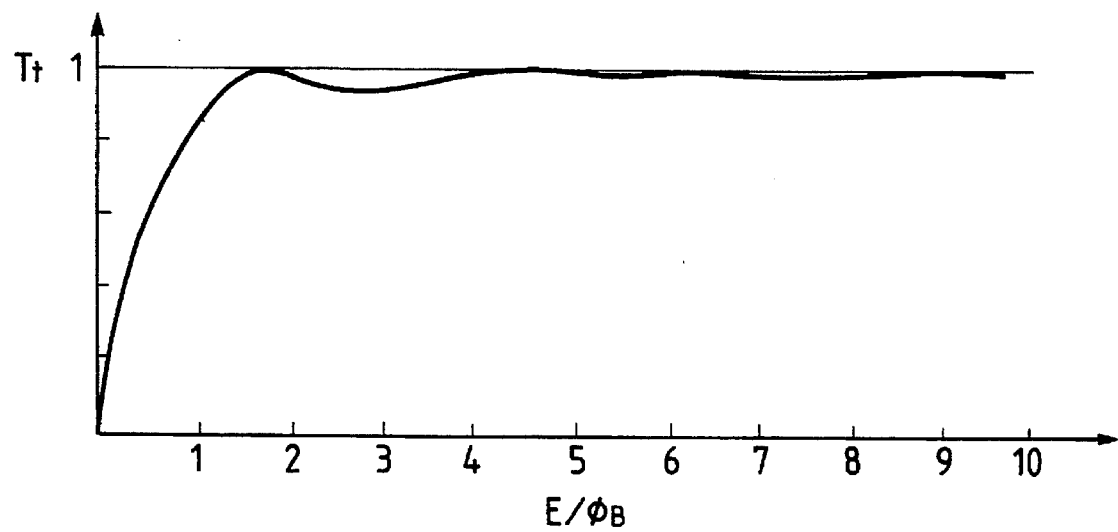
FIG. 8B is an illustrative diagram showing the relationship between potential and distance when a considerable voltage is applied on the tunnel film.

As an example, if $m^* \phi_{Bh} a^2/\hbar^2=8$, the transmission probability $T_{th}$ will be as shown in FIG. 8B. Here, E is the energy of electrons, and when $E/\phi_{Bh}<1$, transmission probability is markedly lowered. Since E is generally about kT, the positive hole impeding effect occurs when $\phi_B > kT$.

Figure 9:
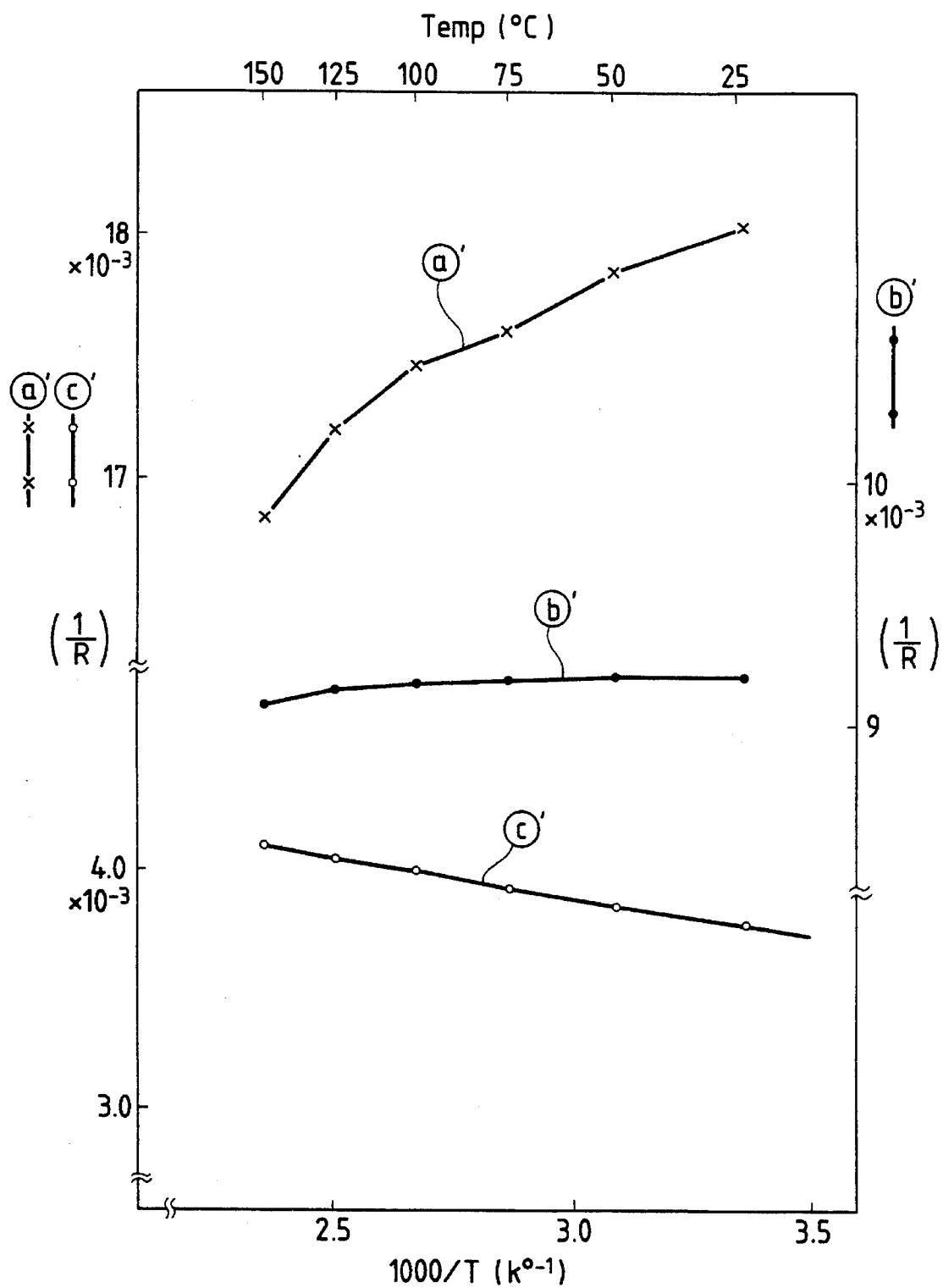
FIG. 9 is a graph showing the temperature characteristics of a reciprocal number of the sheet resistance of a polycrystalline silicon.

FIG. 9 shows the characteristics of a reciprocal number (electro-conductivity) of the sheet resistance R of the polycrystalline silicon practiced in the present invention versus reciprocal number of temperature T.

In the case of (a)', the concentration of polycrystalline silicon is the highest, and then the concentration becomes lower in the order of (b)', (c)'. In this case, the deposition temperature, the thickness, the heat treatment are the same conditions.

In (b)', (c)', the potential as previously mentioned arises, and the mechanism of current flow becomes predominantly heat electron radiation type, whereby characteristics are changed. Improvement of the BPT characteristics is effective if at least 1/R is flat versus temperature, or 1/R is increased by temperature elevation.

As contrasted to the emitter comprised by polycrystalline silicon of (a)', the BPT by use of the polycrystalline silicon of (b)', (cP' is reduced in base current successively as ⅔, ⅓. Accordingly, $h_{FE}$ becomes respectively 1.5- and 3-fold.

As shown in FIG. 1, the first $n^+$ region 6 is formed within a single crystal. In the case of determining base current, the first $n^+$ region 6 also becomes an extremely important factor.

Figure 10A:
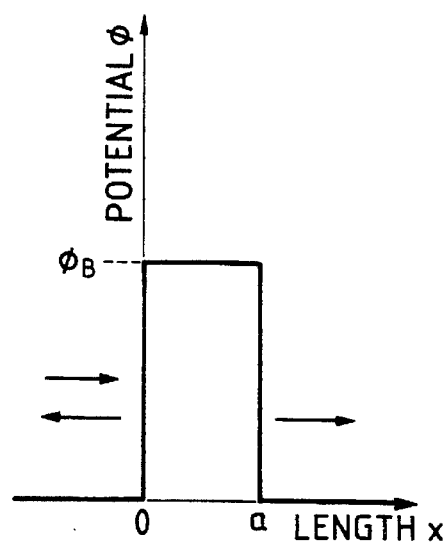
FIG. 10A and FIG. 10B are diagrams showing the relationship between potential and distance for illustration of tunnel film.

Next, the above-mentioned tunnel effect is to be described. When electrons from the semiconductor material layer 8 pass through the emitter region $E_R$ shown in FIG. 6, it can be described by referring to a model of barrier potential as shown in FIG. 10A. Here, when $\phi_B$ is defined as the barrier height and a as the barrier width, the tunnel probability $T_{te}$ of the electron with an energy E having an effective mass $m^*$ becomes as follows from the Schrodinger's wave equation:

$$T_{te} = \left[ 1 + \frac{\phi_B^2 \sinh^2 \beta a}{4E(\phi_B - E)} \right]^{-1} \tag{3}$$

wherein $$\beta = \left[ \frac{2m^*(\phi_{Be}-E)}{\hbar^2} \right]^{1/2}$$

Here if $\phi_B \gg E$, $\beta a \ll 1$, $T_t$ becomes as follows:

$$T_t \approx 16 \frac{E}{\phi_B} \exp(-2\beta a) \tag{3}'$$

wherein $$\beta = (1m^* \phi_B)^{1/2}/\hbar \tag{4}'$$

Figure 10B:
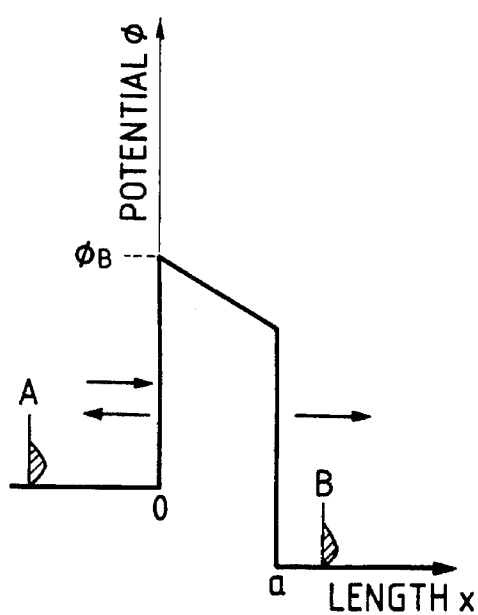

Next, when a voltage is applied, the potential becomes inclined in the thin film 30 as shown in FIG. 10B, whereby the tunnel probability $T_t$ is increased.

Here, the total tunnel current $I_{et}$ may be speculated as follows:

$$I_{et} = A \int_{EC}^{\infty} F_{c1}(E) n_{c1}(E) T_{te}(1 - F_{c2}(E)) n_{c2}(E) dE \tag{5}$$

In the above formula, A is a constant, $T_t$ the tunnel probability in the above formula (1), $F_{c1}$, $F_{c2}$ are Fermi-Dirac distribution functions of the above-mentioned semiconductor material layer 8 and the emitter region $E_R$, and $n_{c1}$, $n_{c2}$ represent the state densities of the conduction bands of said both materials.

In the foregoing formula (4), when $\phi_B \gg E$, the item concerned with the thickness of the thin film 30 comes outside of the object to be integrated, becoming as follows:

$$I_{et} \propto \exp.(-2\beta a)$$

whereby it can be understood that an exponential functional effect occurs in the thickness of the thin film 30. Thus, the thickness contributes most greatly to the electron tunnel current $I_{et}$.

In the foregoing formula (5), another important item is the following item:

$$F_{c1}(1-F_{c1})$$

wherein $F_{c1}$ denotes a probability of existence of electrons at a side of A. $(1-F_{c2})$ denotes a probability of non-existence of electrons at a side of B, and a product thereof greatly effects a probability of an electron transition, but for increasing the item of this product, a voltage corresponding to about kT or higher may be applied on the thin film 30, and, for example, it may be about 0.0025 V at room temperature.

In the case of BPT, the voltage is above the above-mentioned voltage value and, as shown in FIG. 10B, during voltage application, the existing probability is shifted in energy as shown by A, B, whereby in the energy band having the same energy as the energy of electrons on side of the semiconductor material layer 8 (the left side in FIG. 10B), there exists no electron on the emitter side (right side in FIG. 10B) and transition of electrons can be readily effected. Also, by voltage application on the thin film 30, the barrier height is slightly reduced.

In the present invention, as shown in FIG. 6, both the thickness $W_{EO}$ of the emitter region $E_R$ and the concentration Ni are important factors for reducing the base current.

Usually, the above-mentioned thin film 30 has a thickness of 50 [Å] or less, which is comparatively smaller as compared with the thickness of the $n^+$ emitter region 6, and the distance $W_E$ from the emitter-base junction portion to the polycrystal layer 8 is represented by:

$$W_E = W_{EO} + \delta$$

and becomes substantially equal to $W_{EO}$.

On the other hand, another important factor in the present invention, namely inhibition of minority carriers injected from the base, is effected at the interface between the polycrystal layer 8 and the thin film 30. Of course, since the tunnel probability for electrons and positive holes in the thin film 30 is greater for electrons, the reduction effect of the base current by positive holes is obtained as the overlapping action of both.

Next, the constituents of the current of the above-mentioned BPT are to be described.

The collector current $J_c$ is approximately represented by the following formula (6):

$$J_c = \frac{q \cdot D_n \cdot n_i^2}{N_B \cdot W_B} \left\{ \exp\left(\frac{V_{BE}}{kT}\right) - 1 \right\} \quad (6)$$

wherein the diffusion distance is made longer than the width. $N_B$ is the base concentration, $W_B$ the base width, $D_n$ the diffusion distance of electrons, $n_i$ the intrinsic carrier density of Si and $V_{BE}$ the base-emitter applied voltage.

On the other hand, the base current comprises the recombination current $J_{Brec}$ in the base and the diffusion current $J_{Bdiff}$ of the positive holes injected from the base into the emitter.

Here, the recombination current $J_{Brec}$ is represented by:

$$J_{Brec} = \frac{q \cdot D_n \cdot n_i^2 \cdot W_B}{2 N_B \cdot L_n^2} \left\{ \exp\left(\frac{V_{BE}}{kT}\right) - 1 \right\} \quad (7)$$

wherein $L_n$ is the diffusion distance of electrons.

In brief, in the homo-junction type BPT of the prior art, $J_{Bdiff}$ is the main component, and no high current gain can be obtained.

The diffusion current $J_{Bdiff1}$ in the homo-BPT of the prior art when the diffusion length $L_P$ of the positive holes is smaller than the emitter thickness $W_E$ (case 1) ($L_P \ll W_E$) is represented by:

$$J_{Bdiff1} = \frac{q \cdot D_P}{L_P} \cdot \frac{n_i^2}{N_E} \left\{ \exp\left(\frac{V_{BE}}{kT}\right) - 1 \right\} \quad (8)$$

On the other hand, when shallowing of the emitter accompanied by higher integration is effected, the relationship becomes $L_P \gg W_E$ (case 2), whereby the diffusion current $J_{Bdiff2}$ is represented by:

$$J_{Bdiff2} = \frac{q \cdot D_P}{W_E} \cdot \frac{n_i^2}{N_E} \left\{ \exp\left(\frac{V_{BE}}{kT}\right) - 1 \right\} \quad (9)$$

Therefore, the diffusion current becomes further whereby the current amplification ratio $h_{FE}$ of BPT is reduced.

In the case of the present invention, when the recombination speed at the hetero-interface is made a negligible value, the diffusion current $J_{Bdiff3}$ is represented by the following formula (10) ($L_P \gg W_E$):

$$J_{Bdiff3} = \frac{q \cdot D_P \cdot W_E}{L_P^2} \cdot \frac{n_i^2}{N_E} \left\{ \exp\left(\frac{V_{BE}}{kT}\right) - 1 \right\} \quad (10)$$

BPT of the present invention, in the above-mentioned case 1, the diffusion current $J_{Bdiff}$ becomes $W_E/L_P$-fold relative to the homo-junction form BPT of the prior art.

Further, for the above-mentioned case 2, the diffusion current $J_{Bdiff}$ becomes ($W_E/L_P$) 2-fold.

Thus, in the present embodiment, the diffusion current $J_{Bdiff}$ can be dramatically reduced. In other words, the current amplification ratio $h_{FE}$ can be dramatically increased.

In the MIS structure BPT of the prior art, there exists no diffusion $J_{Bdiff}$ because $W_E = O$, but other current components exist.

Figure 11:
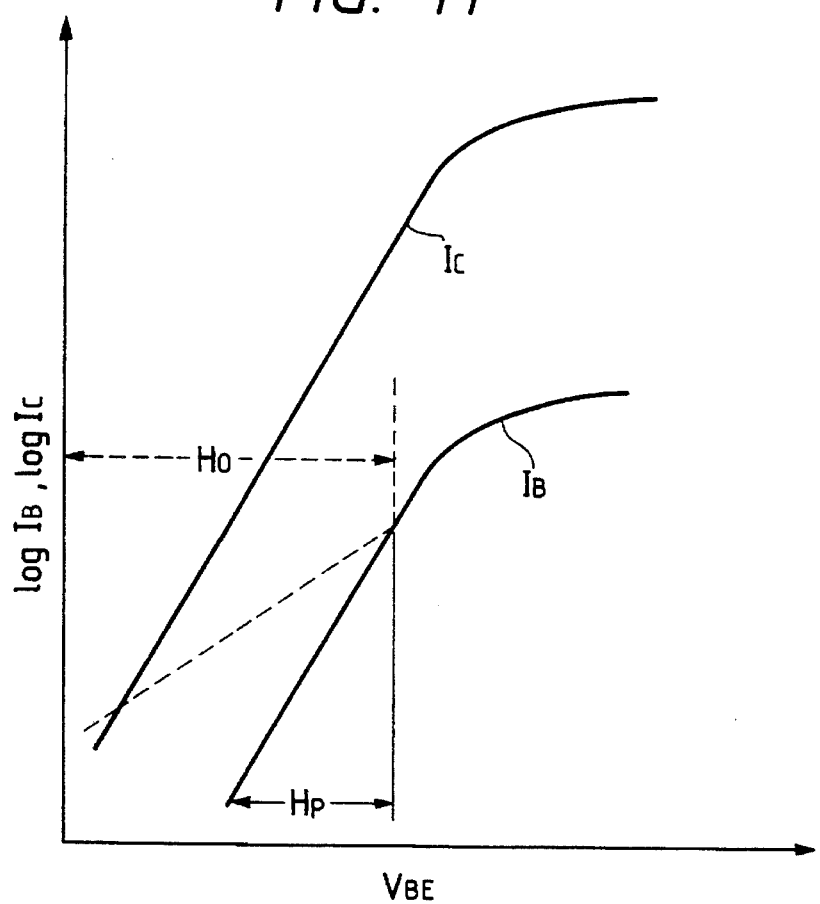
FIG. 11 is a graph for comparison of relationships of voltage, current between the transistor of the present invention and the transistor of the prior art.

FIG. 11 is a graph showing schematically the current-voltage characteristics of the transistor, the axis of abscissa showing the applied voltage between the base-emitter, the axis of ordinate of the base current $I_B$ and the collector current $I_C$ represented in logarithmic values. In the BPT of the present invention, the collector current $I_C$ and the base current $I_B$ become substantially parallel to each other, and also in the fine current region ($H_P$), the current amplification ratio $h_{FE}$ ($=I_C/I_B$) becomes a constant value. In the MIS structure BPT of the prior art, excessive current flows in the fine current region ($H_O$).

The base current in the BPT according to the present invention is primarily the recombination current represented by the above formula (7), and the maximum value $h_{FEmax}$ of the current amplification ratio in this case is as follows:

$$h_{FEmax} = 2(L_n/W_B)^2 \quad (11)$$

and the upper limit of $h_{FE}$ is determined only by the base conditions. According to the present invention, $h_{FE}$ can be made 10,000 or higher.

Figure 12:
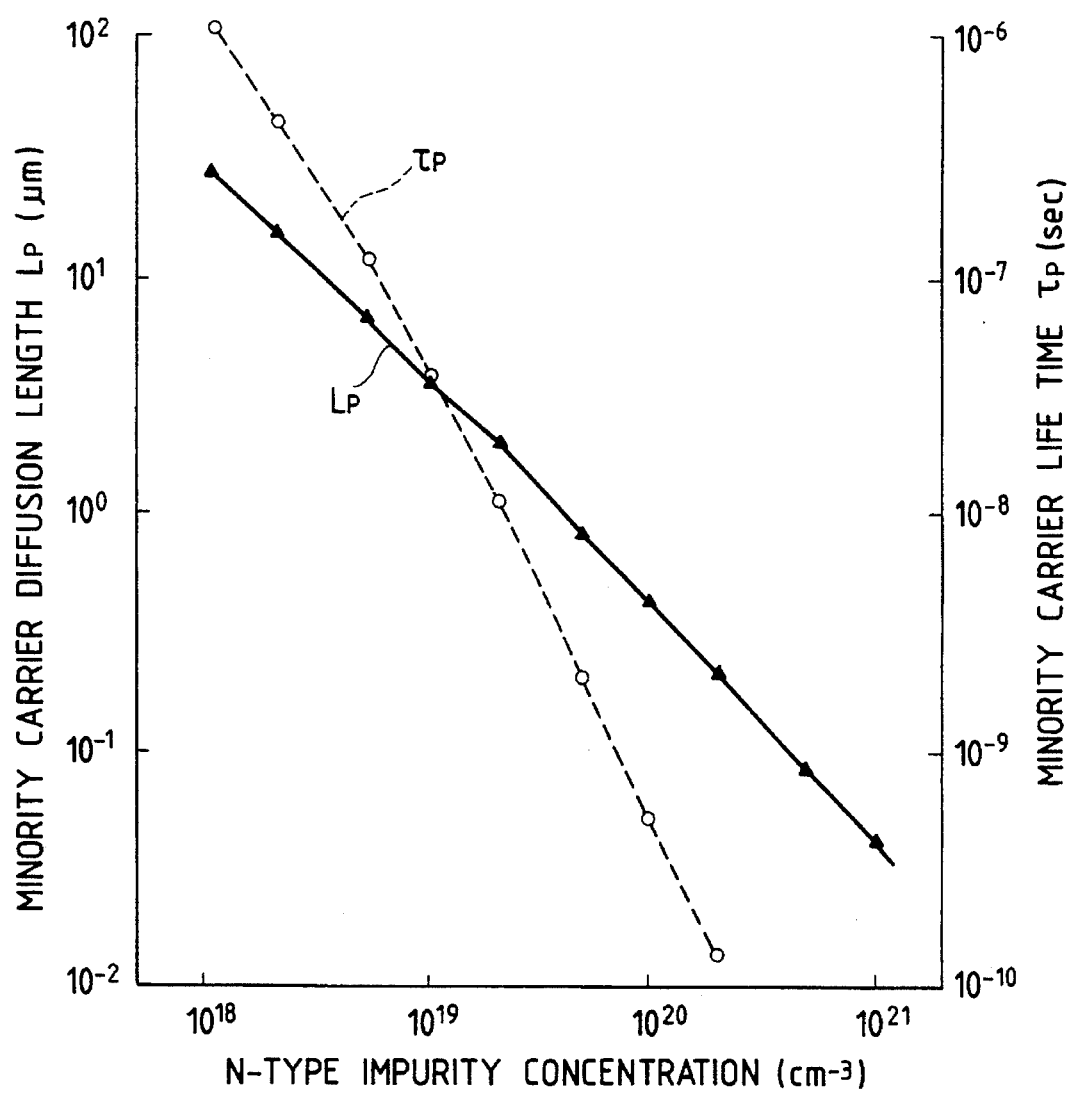
FIG. 12 is a graph showing the relationship between impurity concentration and life of positive holes in the emitter region.

FIG. 12 shows the relationships between the impurity concentration in the above-mentioned $n^+$ emitter region 6 and the diffusion distance $L_P$ of the minority carriers (positive holes) and the life $\tau_P$ of said minority carriers (positive holes). From the condition determined by the formula (10), it is preferable that the emitter depth should be made at least about ⅓ of the diffusion distance of positive holes.

Next, the preparation process of semiconductor device shown in FIG. 1 is to be described.

(1) On a substrate 1 of a predetermined conduction type (p-type or n-type) is formed an n+ embedded region 2 with an impurity concentration $10^{15}$ to $10^{19}$ [cm$^{-3}$] by ion injection (or impurity diffusion, etc.) of As, Sb, P, etc.

(2) By epitaxial technique, etc. an n-type region 3 with an impurity concentration of $10^{14}$ to $10^{17}$ [cm$^{-3}$] is formed.

(3) An $n^+$ region 7 for reducing the resistance of the collector (with an impurity concentration of $10^{17}$ to $10^{20}$ [cm$^{-3}$]) is formed.

(4) An insulation file 102 for element separation is prepared by the selective oxidation method or CVD method, etc.

(5) In the active region, a $p^+$ region 5 and a $p^+$ region 4 which is the base region are formed by the ion injection method; etc.

(6) After opening of an emitter contact on the insulation film 101, an $n^+$ emitter region doped with As, Sb, P, etc. (impurity concentration $5 \times 10^{17}$ to $5 \times 10^{20}$ [cm$^{-3}$]) 6 is formed by the ion injection method or the thermal diffusion method.

(7) A thin film 30 prepared by oxidation at lower temperature of 500° to 650 [°C.] or by thermal oxidation by rapid thermal acceleration (RTA).

(8) After deposition of a polycrystalline Si doped to $n^+$ according to the LPCVD (Low Pressure Chemical Vapor Deposition) method, and introduction of impurities by ion injection, diffusion, etc., it is subjected to patterning.

(9) An insulation film 103 is deposited, which is annealed and then subjected to opening of contact.

(10) An Al—Si (1%) which becomes the electrode 200 is subjected to sputtering, followed by patterning of the Al—Si.

(11) After alloy formation of the Al—Si electrode, a passivation film is formed.

According to the procedure as described above, as MIS structure BPT is completed.

As the above-mentioned thin film 30, a silicon oxide film is the optimum, because it can be easily formed at low temperature, but an insulation film such as silicon nitride film, alumina film, etc. may be also employed.

Also, by use of SiC, etc., a structure which becomes the tunnel type barrier may be formed. For example, single crystal SiC, as compared with Si has a conduction band energy difference $\Delta Ev=0.53$ [eV], a valence electron band difference $\Delta Ec=0.55$ [eV] and a band gap $Eg=2.2$ [eV], and when both SiC and Si are junctioned stepwise in n-type, it comes to have a structure different from the semiconductor/insulator junction.

Figure 13A:
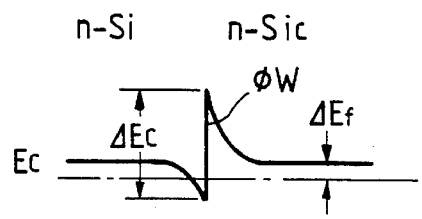
FIG. 13A is an illustrative diagram showing the energy level of junction of n-type Si and n-type SiC.
Figure 13B:
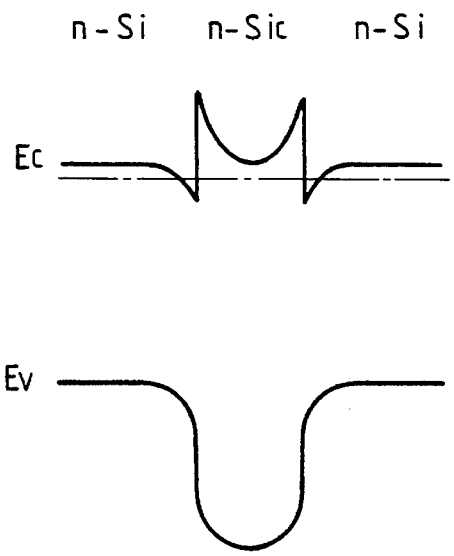
FIG. 13B is an illustrative diagram showing the energy level of junction of n-type Si, n-type SiC, and n-type Si.
Figure 13C:
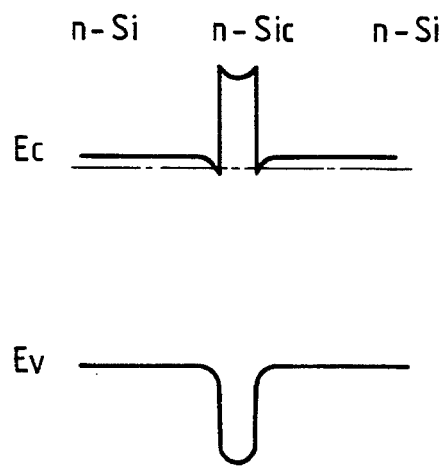
FIG. 13C is an illustrative diagram showing the energy level of junction of n-type Si, n-type SiC of thin film, and n-type Si.

FIG. 13A, 13B, 13C each show a band structure of hetero-junction mutually of the same conduction type (n-type in this case), namely the iso-type.

FIG. 13A shows the junction of the n-type Si and the n-type SiC, $\Delta Ec$, $\Delta Ev$ appearing respectively above and below, and a barrier $\phi_W$ called notch being formed on the conduction band side, while on the valence electron side, an energy difference of the following is created:

$$\Delta Ec + \Delta Ev - \Delta Ef \quad (12)$$

On the other hand, by junction of the n-type Si, the n-type SiC and the n-type Si, the energy level becomes as shown in FIG. 13B.

Further, by forming SiC into a thin film, the SiC will be depleted to become similar to an insulation material, whereby the energy level becomes as shown in FIG. 13C.

With the structure shown in FIG. 13C, the electron current can be made greater. In FIG. 13A to FIG. 13C, an example by use of SiC is shown, but it will be apparent that other materials with broad forbidden band gap$^\Delta$ can be also employed.

Figure 14:
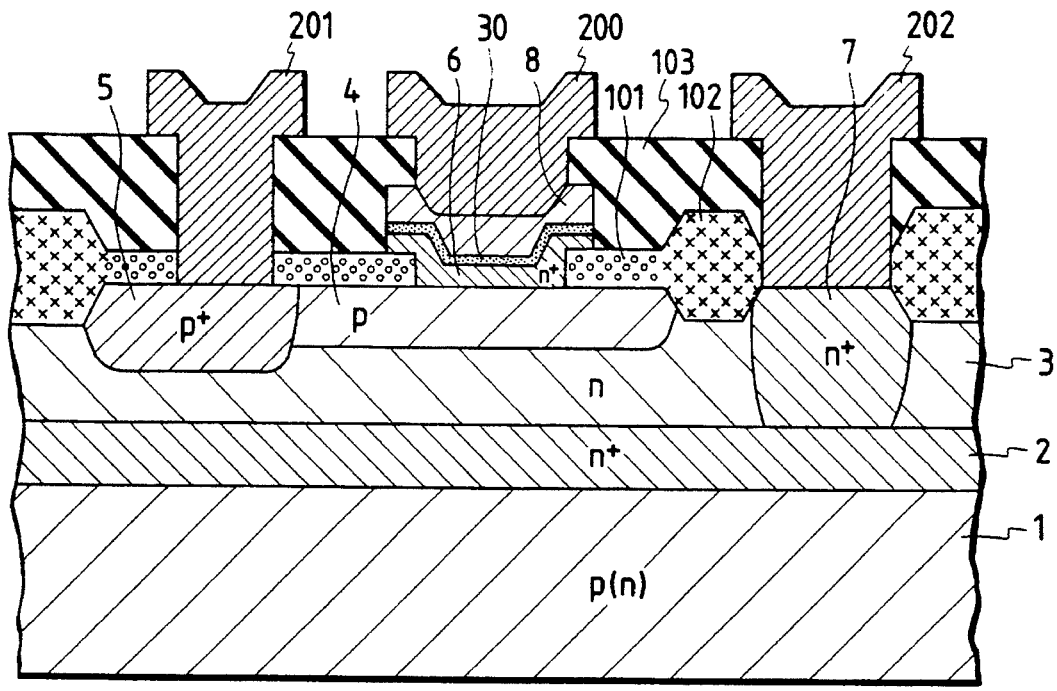
FIG. 14 is a cross-sectional view of a semiconductor device showing the second embodiment of the present invention.

FIG. 14 shows a second semiconductor device according to the second embodiment of the present invention. In this embodiment, an emitter region 6 is formed by epitaxial growth on the base region (p-type region 4), and on the emitter region 6 is formed a thin film 30 for tunnel. By making such structure, it becomes that there is no carrier diffused there-around due to no area distributed within base, whereby it becomes possible to obtain a current amplification ratio which is approximate to the above-mentioned maximum amplification ratio $h_{FEmax}$.

Figure 15:
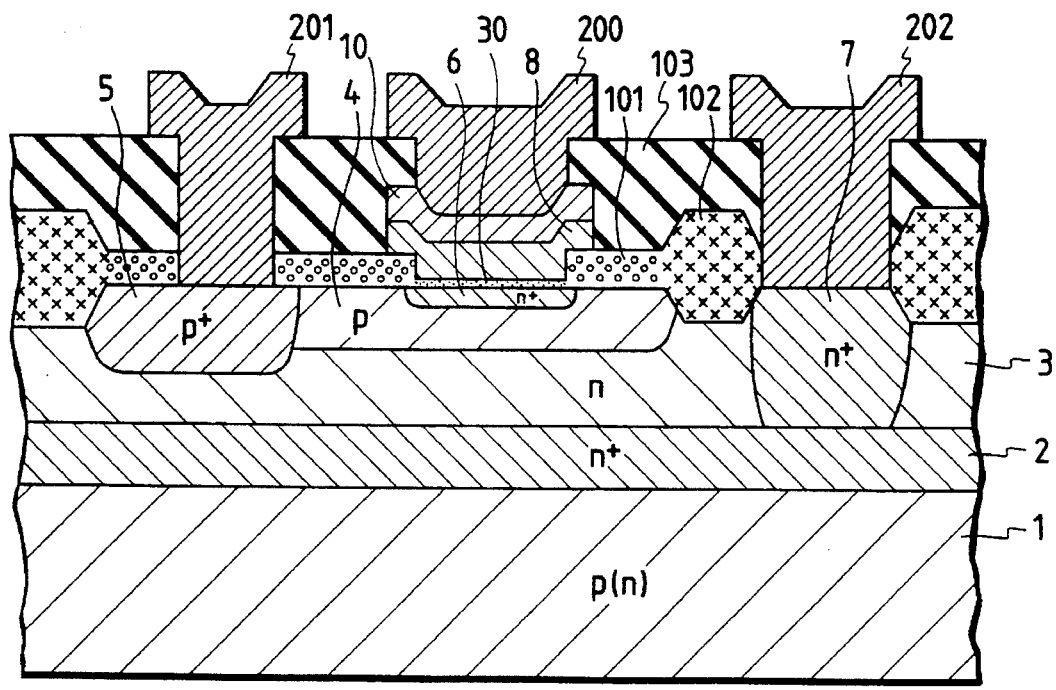
FIG. 15 is a cross-sectional view of a semiconductor device showing the third embodiment of the present invention.

Next, FIG. 15 shows the third embodiment of the semiconductor device of the present invention, and this embodiment is different from the above-described first embodiment in that a semiconductor material layer 8 is formed on the thin film 30 and a semiconductor layer 10 of a material with broader forbidden band gap than said semiconductor material layer 8 is further formed on said semiconductor material layer 8. With such construction, ohmic resistance between the emitter and the metal is improved. If the semiconductor material layer 8 is a polycrystalline or amorphous SiC, the semiconductor layer 10 should be preferably selected as Si, while if the semiconductor material layer 8 is Si, it is desirable that Ge, etc. should be used as the semiconductor layer 10.

The conduction type of the semiconductor layer 10 is the same as that of the semiconductor material layer 8.

Figure 16:
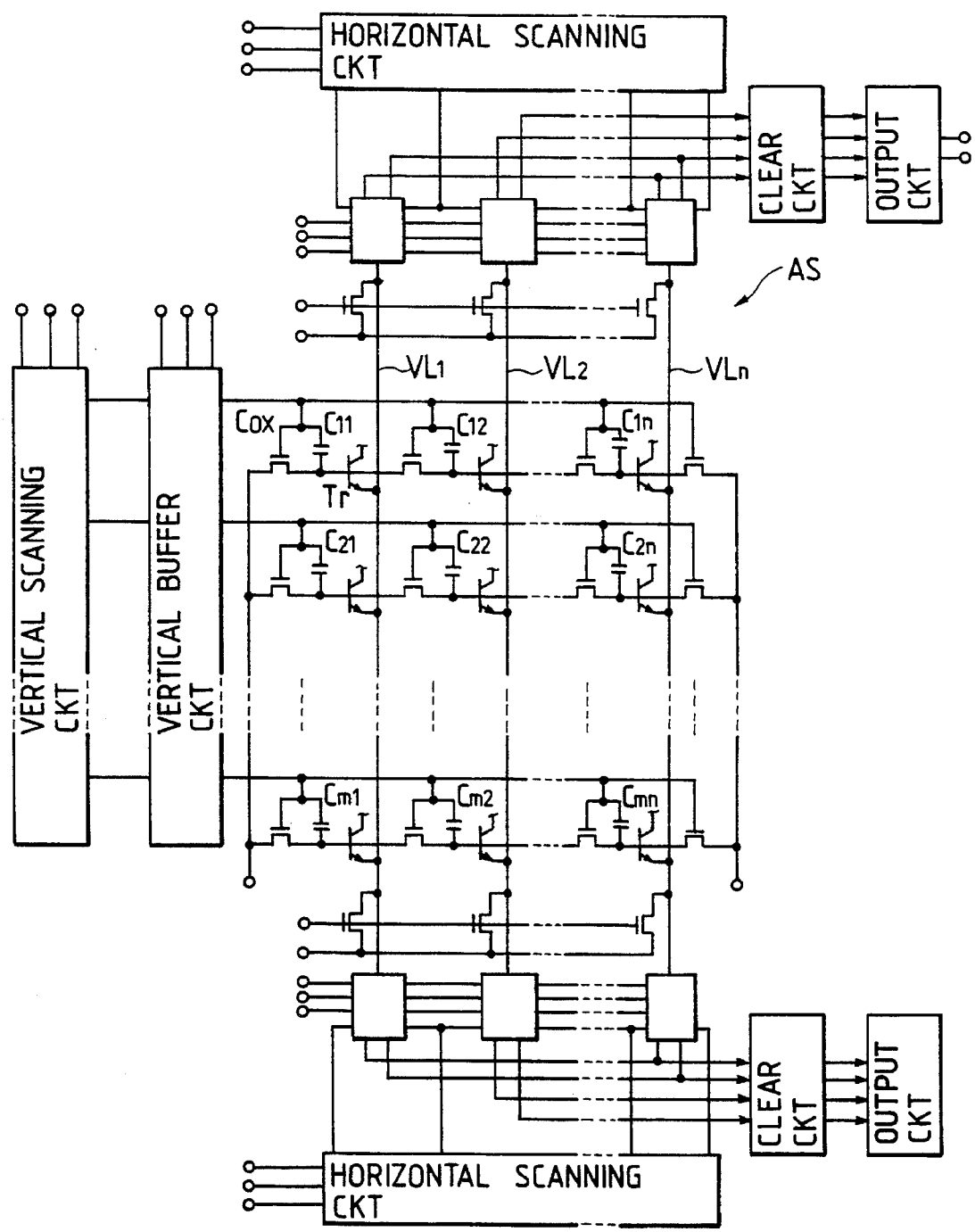
FIG. 16 is a circuit diagram showing an embodiment of the electronic device by use of the semiconductor device according to the present invention.

FIG. 16 is a circuit example showing an example of the electronic device as an application example of the semiconductor device according to the above-mentioned embodiment. It shows the case when the BPT shown in the above-described embodiment 1 is used in the solid image pick-up device disclosed by the present Applicant in Japanese Patent Application No. 62-321423.

More specifically, in FIG. 16, the transistor Tr constituting the sensor cells $C_{11}$, $C_{12}$, ... $C_{mn}$ of the area sensor AS employs the MIS type BPT shown in the above-described first embodiment.

When the area sensor AS shown in FIG. 16 is used as a color camera, the actuation of reading optical information of the same photoelectric converting device for plural times is performed. In this case, for reading for plural times from the same element, the ratio of the electrical output during the first reading to that during the second reading and thereafter is a problem, and correction is required when the value of this ratio has become smaller.

When the ratio of the first reading output to the second is defined as the non-destruction degree, the non-destruction degree is represented by the following formula:

$$\text{Non-destruction degree} = (C_{tot} \times h_{FE}) / (C_{tot} \times h_{FE} + C_v) \quad (13)$$

Here, $C_{tot}$ indicates the total capacity of the transistor Tr connected to the base shown in FIG. 16, which is determined by the base-collector capacity $C_{bc}$ and $C_{ox}$. $C_v$ is the floating capacity of the reading line shown by $VL_1$, ... $VL_n$. However, $C_{ox}$ may not exist sometimes depending on the circuit system.

Therefore, the above-mentioned non-destruction degree can be easily improved by increasing the current amplification ratio $h_{FE}$. In other words, the non-destruction degree can be made greater by increasing $h_{FE}$.

Here, in an area sensor corresponding to HD (High Division), namely high vision, since $C_{tot}=10$ [pF], $C_v=2.5$ [pF], for example, for making the non-destruction degree 0.90 or higher, $h_{FE}$ is required to be 2250 or higher. For obtaining sufficient non-destruction degree, it may be estimated that $h_{FE}$ is required to be 2000 or higher.

In contrast, in the prior art, for example, in homo-junction BPT, $h_{FE}$ is about 1000, and hence no sufficient non-destruction degree can be obtained, while in the semiconductor device of the present invention, excellent non-destruction degree can be obtained because $h_{FE}$ can be made sufficiently great in the semiconductor device of the present invention.

Further, desirably, the non-destruction degree should be 0.98 or higher. In this case, $h_{FE}$ is required to be about 10,000 or more, but it is difficult to obtain such a value in the homo-junction BPT of the prior art.

In the embodiment shown in FIG. 16, an area sensor was exemplified, but the present invention is also applicable to a line sensor as a matter of course.

Also, for the transistor, BPT as described in the second and third embodiments can be employed.

Referring not to FIG. 1, the fourth embodiment of the semiconductor device of the present invention is described.

In this embodiment, similarly as in the first embodiment, the above-mentioned thin film 30 is formed extremely thinly (thinner than the MIS structure BPT of the prior art) so that there may be little difference in tunnel probability in both the carriers of positive holes and the electrons. At least positive holes contribute sufficiently as the carriers of current, and the positive holes passed through said thin film 30 are impeded by the polycrystalline layer 8.

Said thin film 30 comprises a thin insulation material for flowing tunnel current therethrough.

In a polycrystalline silicon, in the region (b) shown in FIG. 5, when the grain size of the polycrystal becomes smaller, the quantum effect as described in detail below will occur.

More specifically, for example, when a $n^+$ type polycrystalline silicon is considered, the state in which free electrons are confined within one grain because of the potential barrier formed at its grain boundary may be realized. As the result, fine particles will behave as if a three-dimensional potential well is formed by the grain boundary, and the electrons ordinarily existing continuously in the conduction band will exist scattered by such well.

When the above-mentioned well is approximated as a cube with one side of a, the energy of electrons existing at the conduction band may be represented by the following formula:

$$E_{n1,n2,n3} = \frac{\pi^2 \hbar^2}{2a^2} \left\{ \frac{n_1^2 + n_2^2}{m_t} + \frac{n_3}{m_l} \right\} \quad (14)$$

$m_l$, $m_t$ are respectively the longer axis and shorter axis of the effective masses of the electrons, and $n_i$ is an integer.

When the film thickness of the polycrystalline silicon layer is made, for example, 100 Å, the above-mentioned formula (14) becomes as follows:

$$E_{n1,n2,n3} = 4 \times \{5 (n_1^2 + n_2^2) + n_3^2\} \quad (15)$$

Figure 17A:
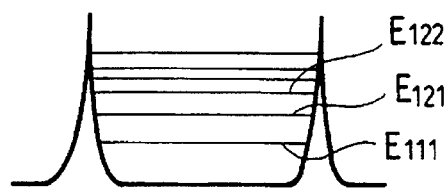
FIG. 17A through FIG. 17D are views for illustration of quantization of the energy of electrons in polycrystalline layer.

FIG. 17A shows schematically the manner of quantization of the energy of electrons.

As shown in the same Figure, the energy of the electrons is dispersed in the conduction band ($E_{11}$, $E_{121}$, $E_{122}$, etc.). For example, supposing that they follow the above formula (15), when one side a of the above-mentioned well is a=100 Å, the lowest energy (base energy) of the electrons will be higher by 20 [meV] than the conduction band. The electrons of the impurities introduced into the polycrystalline silicon will embed successively at this level.

Figure 17B:
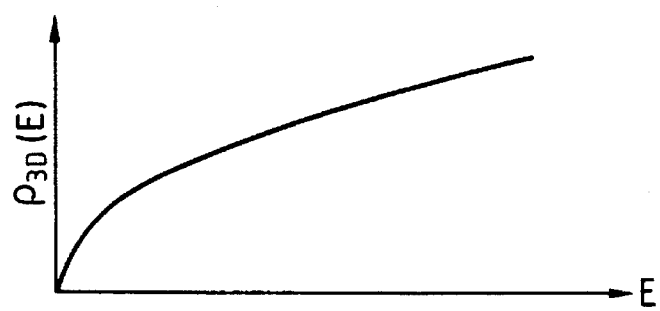
Figure 17C:
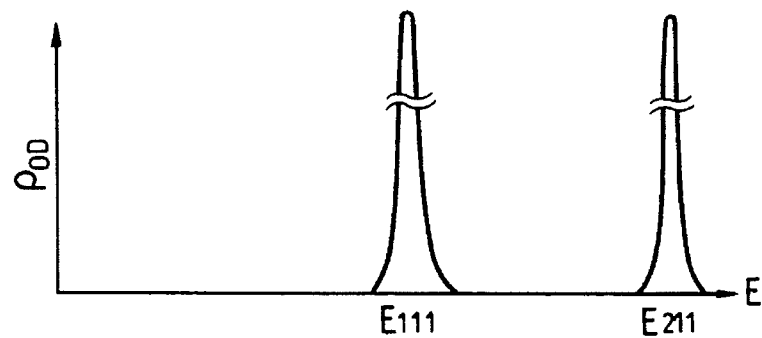

FIG. 17B shows the state density $P_{3D}$ of an ordinary semiconductor of the prior art versus energy F. By three-dimensional quantization, the state density $P_{0D}$ will take a scattered value at energy $E_{111}$, $E_{211}$ as shown in FIG. 17C.

Figure 17D:
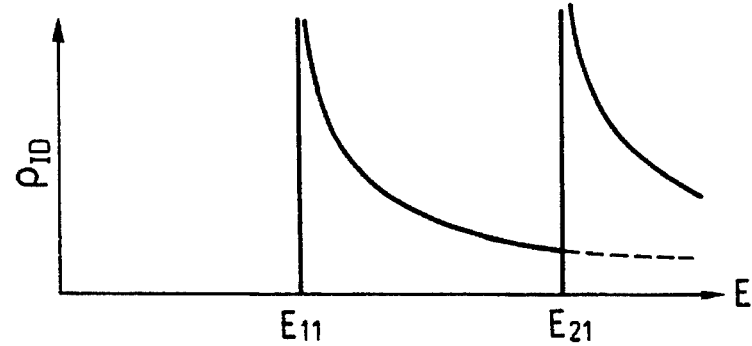

Having explained above by referring to the well as a cube, also in the case of a columnar shape, quantization is effected as its dimensions become smaller. In this case, as shown in FIG. 17D, a scattered state density $P_{1D}$ is possessed at the energy $E_{11}$, $E_{21}$. More specifically, although electrons can be filled continuously for energy under crystalline state, only noncontinuous energy of electrons can be taken by quantization, resulting in change of the Fermi level of the polycrystalline silicon. Thus, also in the materials having the same impurity density, as the well becomes columnar, cubic, the energy level of the electrons will be scattered (FIG. 17C), and when the electrons are filled at this level, if one side is of the same size, the electrons exist even to the place of the cubic material with the highest energy. In other words, in the case of a cubic body, the Fermi level becomes the highest. To further add, in quantization of cubic body, columnar body, the quantization effect will be greater as the dimensions are smaller.

According to the experimental data, with a film thickness of the polycrystal layer being about 50 to 100 [Å], the change in Fermi level can be sufficiently seen. With a thickness of 500 [Å] or higher, there is substantially no effect, and the quantization effect occurs with a thickness of 300 [Å] or less.

Figure 18:
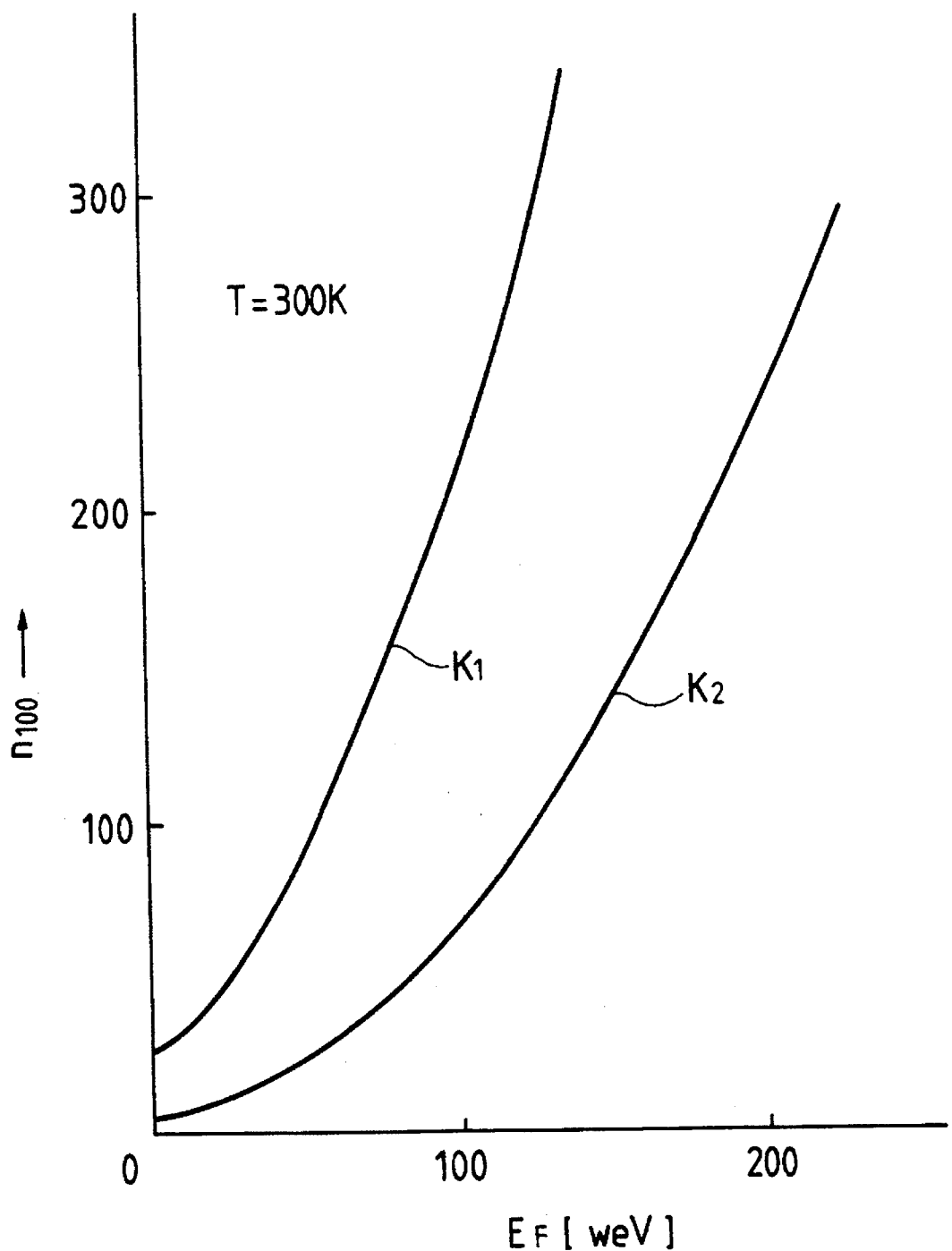
FIG. 18 is a graph for illustration of the change of Fermi energy when electrons are packed in a cubic well.

FIG. 18 shows the simulation results of the number of electrons $n_{100}$ filled in the well of a cube with one side of 100 [Å] calculated for the change in Fermi energy $E_F$. The curve $K_1$ shows the case of a crystal, and the curve $K_2$ the case when quantized. However, Fermi energy on the axis of abscissa is the energy value measured from the bottom of the conduction band, and it can be understood from this Figure that Fermi energy will be introduced into the conduction band as the electrons are increased. Fermi energy will exist on the conduction band, as the impurity concentration is increased, and the dimensions of the cubic body are smaller.

When the polycrystalline silicon is of the P-type conduction type, Fermi level exists within the valence electron band.

On the other hand, the upper limit and the lower limit of the impurity concentration are determined by the position of the region (b) in FIG. 4, and the region (b) is the most desirable. Since this is determined from the size of the grains of the polycrystal and the interface level of the grain boundary, it should be properly determined from the experimental results. If the size of grain becomes smaller, the region (b) will be shifted toward the higher concentration side.

Figure 19:
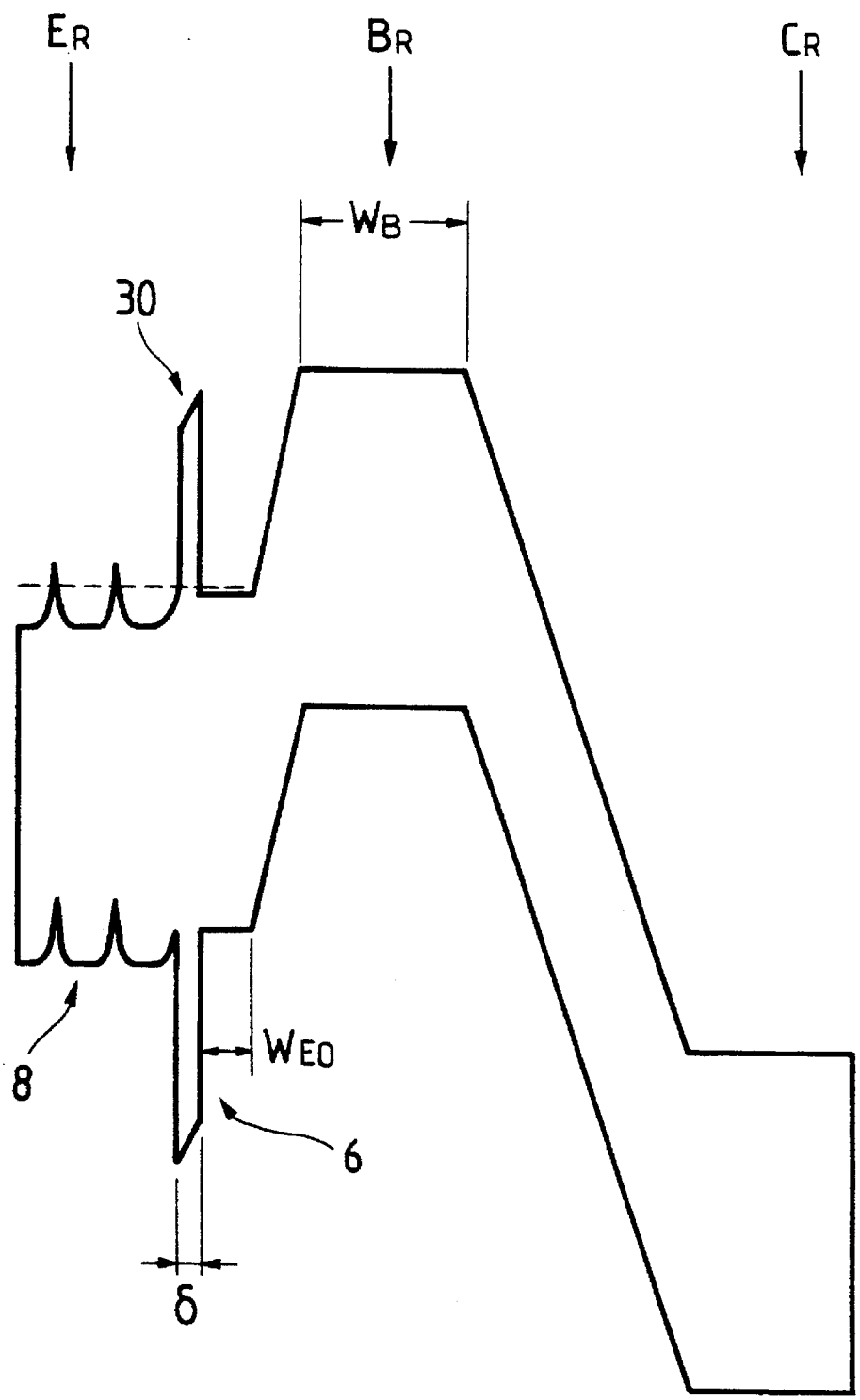
FIG. 19 is a diagram showing the potential along the line A—A' in FIG. 1.

FIG. 19 shows a potential diagram along the line A—A' in FIG. 1.

IN FIG. 19, $W_B$ shows the neutral region width of base, $W_{EO}$ the neutral region width of the emitter and $\delta$ the thickness of tunnel ultra-thin film.

To summarize, the most important point in the present invention resides in small grain of the polycrystal in the $n^+$ emitter region 6 and the polycrystal layer 8 to give rise to the quantization effect, giving different height of Fermi level, whereby the region of the polycrystal layer 8 becomes a barrier against the positive holes injected from the base and therefore diffusion of positive holes is impeded to reduce base current. The tunnel thin film 30 is formed in a ultra-thin film (approximately 10 [Å] or less) so that both carriers of electrons and positive holes may show the tunnel phenomenon, and the emitter resistance is also lowered.

The greatest characteristic function of the above-mentioned thin film 30 is separation of the polycrystal layer 8 from the $n^+$ region 6 which is a single crystal, simultaneously with flattening of the interface, and also effects stabilization of the polycrystal layer 8.

More specifically, as described above, for example, when surface washing is completely effected by sputtering, heat treatment, etc. on the $n^+$ region 6 which is merely a single crystal as in the prior art structure shown in FIG. 7A to deposit the polycrystal layer 8 under the surface state without naturally oxidized film, a crystal with about a grain size of polycrystal is epitaxially grown on the single crystal, whereby the interface with the inherent single crystal (B—B' in FIG. 7A) changes to become wavy (or epitaxially grown thinly, followed by becoming wavy), and no constant shape can be always maintained. If the cleaning process on the surface is insufficient and a polycrystal is deposited on the naturally oxidized film and subjected to heat treatment at 1000° C. or higher, the oxide film may be partially broken to effect locally epitaxial growth. In an extreme case, the naturally oxidized film becomes shaped like a ball, and the polycrystal recrystallized in single crystals.

Thus, in the case of the prior art structure, all of the interfaces between single crystal and polycrystal become unflat, thereby causing variance in characteristics of BPT to occur.

More specifically, when the carriers injected from the base into the emitter are recombined, the emitter becomes internally nonuniform, and therefore in individual BPT prepared, the base current values are not constant, whereby variance between the respective BPT becomes larger.

In the present invention, as shown in FIG. 7B, the thin film 30 is formed on the $n^+$ region 6 which is a single crystal, and the polycrystal layer 8 formed on said thin film (silicon oxide film in this embodiment), and therefore its interface is flat on the atomic order. The polycrystalline 8, which is deposited through the stable thin film 30, is not susceptible to rearrangement of the polycrystal by heat treatment and also stable in the later heat treatment. In microcrystal Si, amorphous Si, etc. of the prior art (deposition temperature 100° to 300° C.), their characteristics are readily changed by heat treatment at 400° to 600° C., whereby deterioration of current amplification ratio $h_{FE}$ will readily occur.

In the present invention, because the crystal is a polycrystal, the deposition temperature becomes high. For example, in polycrystalline Si, the temperature is about 550° to 650 [°C.], the crystal grain size is large on the surface of the polycrystal, but substantially no hydrogen is contained, and there is little change of crystal grain size in subsequent steps and also no change by elimination of hydrogen will occur. However, it has been confirmed that the grain size in the vicinity of the interface with $SiO_2$ is small (50 to 100 Å). In the case of the polycrystalline Si in the present invention, it can stand sufficiently a temperature up to 900 [°C.] to give an extremely stable BPT.

Since the interface of the polycrystal layer 8 exists at the interface with the thin film 30, the interface with the emitter region which is a single crystal is extremely flat. This exists an extremely important factor in stabilizing the BPT characteristics.

As is apparent from the above description, the material of the above-described thin film 30 is required to be stable, and therefore should be desirable chemically stable materials such as $SiO_2$, $Si_3N_4$, SiC, $Al_2O_3$, etc. Further, the interface between the thin film 30 and the single crystal is also extremely important, and the recombination level of the interface is required to be made low.

In the present invention, as shown in FIG. 19, the thickness $W_{EO}$ and the concentration Ni of the emitter region $E_R$ are also important factors for reducing base current. FIG. 19 shows the potential diagram at the cross-section A—A' corresponding to the present embodiment in FIG. 1, and in the same Figure, $E_R$ shows the emitter region, $B_R$ the base region, and $C_R$ the collector region.

Next, the process for preparation of the semiconductor devices of the present embodiment shown in FIG. 1 is described.

(1) On a substrate 1 of a predetermined conduction type (p-type or n-type) is formed an $n^+$ embedded region with an impurity concentration of $10^{15}$ to $10^{19}$ [cm$^{-3}$] by ion injection (or impurity diffusion, etc.) of As, Sb, P, etc.

(2) By epitaxial technique, etc. an n-type region 3 with an impurity concentration of $10^{14}$ to $10^{17}$ [cm$^{-3}$] is formed.

(3) An $n^+$ region 7 for reducing the resistance of the collector (with an impurity concentration of $10^{17}$ to $10^{20}$ [cm$^{-3}$]) is formed.

(4) An insulation film 102 for element separation is prepared by the selective oxidation method or the CVD method, etc.

(5) In the active region, a $p^+$ region 5 and a p region 4 which is base region are formed by the ion injection method, etc.

(6) After opening of an emitter contact on the insulation film 101, an $n^+$ emitter region doped with As, Sb, P, etc. (impurity concentration $5\times10^{17}$ to $5\times10^{20}$ [cm$^{-3}$]) 6 is formed by the ion injection method or the thermal diffusion method.

(7) A thin film 30 is prepared by oxidation at lower temperature of 500° to 650 [°C.] or by thermal oxidation by rapid thermal acceleration (RTA).

(8) After deposition of polycrystalline Si doped to $n^+$ according to the LPCVD method, and introduction of impurities by ion injection, diffusion, etc., it is subjected to patterning.

(9) An insulation film 103 is deposited, which is annealed and then subjected to opening of contact.

(10) An Al—Si (1%) which becomes the electrode 200 is subjected to sputtering, followed by patterning of the Al—Si.

(11) After alloy formation of the Al—Si electrode, a passivation film is formed.

According to the procedure as described above, the BPT is completed.

As the above-mentioned thin film 30, a silicon oxide film is the optimum, because it can be easily formed at low temperature, but an insulation film such as silicon nitride film, alumina film, etc. may be also employed.

Also, by use of SiC, etc., a structure which becomes the tunnel type barrier may be formed. For example, SiC, as compared with Si has a conduction band energy difference $\Delta E_v=0.53$ [eV], a valence electron band difference $\Delta E_c=0.55$ [eV] and a band gap $E_g=2.2$ [eV], and when both SiC and Si are junctioned stepwise in n-type, it comes to have a structure different from semiconductor/insulator junction.

With the structure shown in FIG. 13C, tunnel probability of electrons, positive holes can be made greater according to film thickness, whereby the electron current of positive holes, electrons can be made greater. With the structure in FIG. 13B, a hetero-structure similar to that of the prior art is obtained, through which only one of the carriers can be passed. In the present invention, both positive holes and electrons are passed and one of the carriers is impeded by the polycrystal. Si may be monocrystal, polycrystal, or amorphous.

Figure 20:
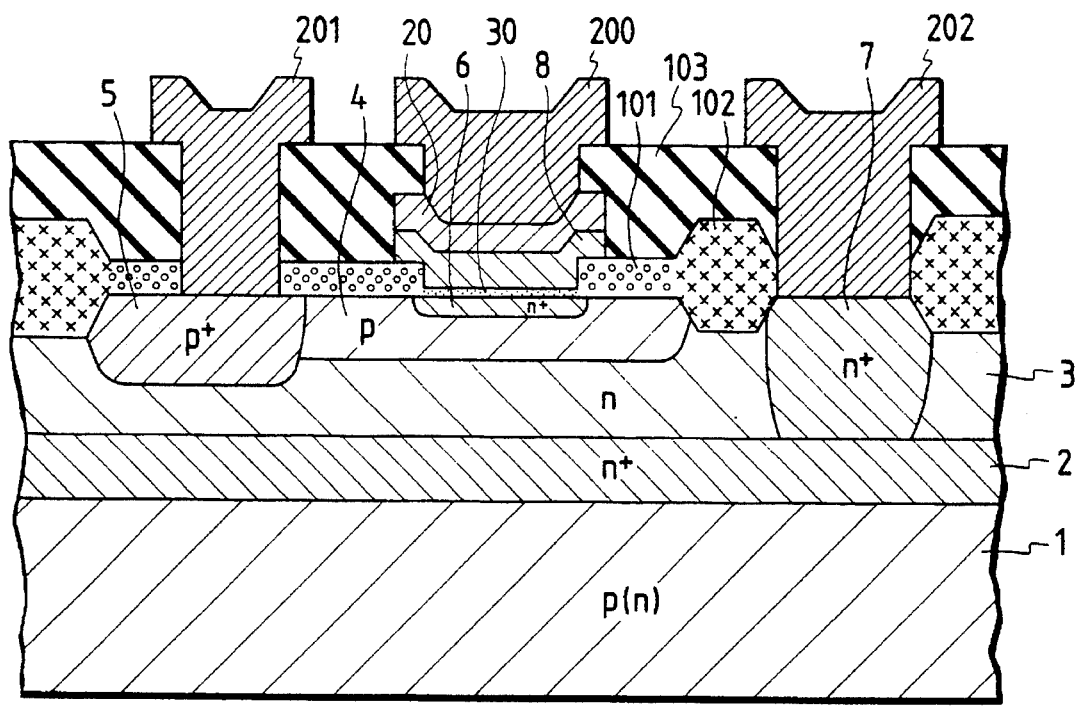
FIG. 20 is a cross-sectional view of a semiconductor device showing the fifth embodiment of the present invention.

FIG. 20 shows a semiconductor device according to the fifth embodiment of the present invention. In this embodiment, on the polycrystal layer 8 having the quantum effect is further formed a low resistance layer 20, and the grain size in the region of said low resistance layer 20 is set greater as compared with that in the region of the polycrystalline layer 8, thereby effecting lower resistance.

As is apparent from FIG. 4, the resistance in the region (b) is extremely sensitive to grain size, and the resistance of the metal electrode at the contact side is lowered even at the same concentration to reduce the emitter resistance.

In this case, in the preparation steps, first a polycrystal layer 8 is deposited to a thickness corresponding to the thickness of the polycrystal layer 8 and the low resistance 20 superposed, and then the region corresponding to the low resistance layer 20 is made amorphous by ion injection, followed by heat treatment to make the grain size only is said amorphous region greater.

Other than such preparation method, the above-mentioned low resistance layer 20 may be made amorphous with As, Sb, P, etc. which is n-type impurity, and then heat treatment may be performed, or alternatively it may be made amorphous with Ge, Si, etc. rather than injection of an impurity. However, the grain size of the polycrystal layer 8 will become larger, unless the heat treatment is carried out at 900° C. or lower.

As another preparation method, there is also a method in which a polycrystalline silicon containing initially an impurity may be deposited, and only the above-mentioned low resistance layer 20 is made amorphous by ion injection with Ge, Si, etc., followed by heat treatment.

It is critical that the amorphous region after ion injection would be made so as not to reach the interface between the polycrystalline silicon and the single crystalline silicon.

Other constitutions are the same as in the first embodiment as described above, and redundant description is omitted.

Figure 21:
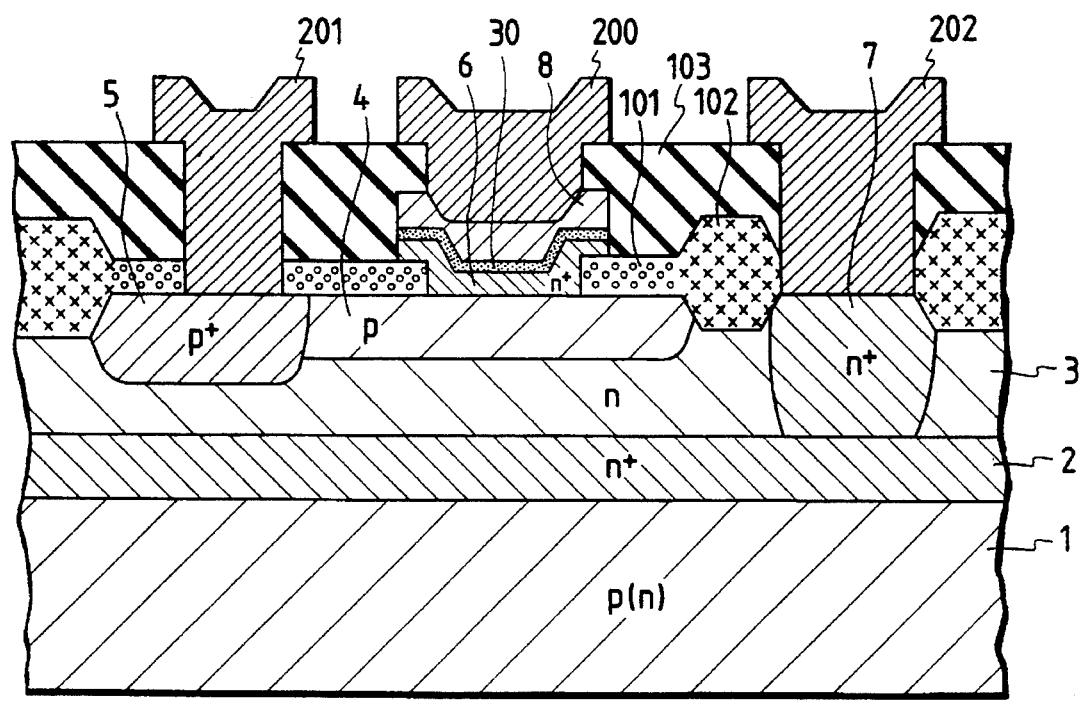
FIG. 21 is a cross-sectional view of a semiconductor device showing the sixth embodiment of the present invention.

FIG. 21 shows the sixth embodiment of the present invention.

In this embodiment, an $n^+$ emitter region 6 is formed by epitaxial growth on the P-type region 4 as the base region, and a thin film 30 for tunnel and a polycrystal layer 8 formed thereon.

With such constitution, since the $n^+$ emitter region 6 is in contact in plane with the base region, diffusion of the carriers into the base region becomes smaller, whereby the lateral direction current of the emitter current becomes smaller to an advantage of the finely formed BPT.

Other constitutions are the same as in the abovedescribed first embodiment, and redundant description is omitted.

Referring to FIG. 1, the seventh embodiment of the semiconductor device of the present invention is described.

Also, in this embodiment, the above-mentioned thin film 30 is formed extremely thinly (thinner than the MIS structure BPT of the prior art) to make substantially no difference between the both tunnel probabilities of the carriers of positive holes and the electrons. At least positive holes also contribute sufficiently as the carriers of current, and the positive holes passed through said thin film 30 are impeded by the polycrystal layer 8.

The polycrystal silicon of this embodiment employs the impurity concentration ratio of the region (c), and the depletion layer width W at the grain boundary is represented approximately by the following formula:

$$W = \frac{2Q_t}{N_i} \quad (16)$$

Ordinarily, tunnelling phenomena of electrons and holes are liable to occur at a film thickness of the thin film of 50 [Å] or less, for example, if the trap level density $Q_t$ is made $5 \times 10^{12}$ [cm$^{-2}$] or the impurity concentration Ni is required to be $4 \times 10^{-19}$ [cm$^{-3}$] or higher. If the film thickness of the tunnel thin film is made 50 [Å] or less, the impurity concentration Ni depends on $Q_t$, but corresponds to the region (c), when the following relationship is valid:

$$Ni \geq \frac{2Q_t}{5 \times 10^{-7}} = 4 \times 10^6 Q_t \text{ [cm}^{-3}\text{]} \quad (17)$$

Figure 22:
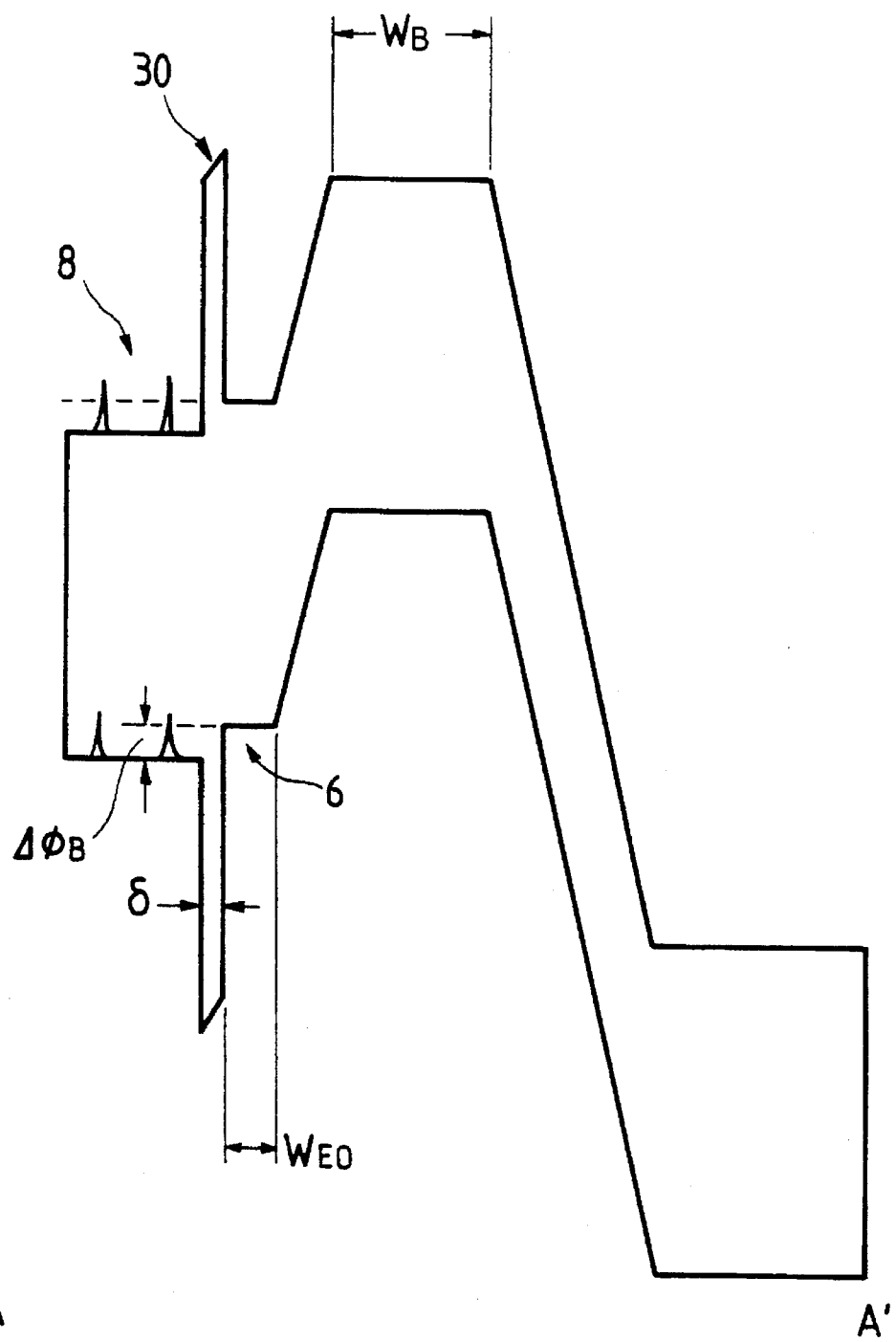
FIG. 22 is a diagram showing the potential along the line A—A' in FIG. 1 which is the emitter region.

FIG. 22 shows the potential diagram in this embodiment the cross-section along the line A—A' in FIG. 1, and the base width is represented by $W_B$, the single crystal emitter depth by $W_{EO}$ and the film thickness of the ultra-thin film by δ. What is the most important is the height $\Delta\phi_B$ of the barrier between the single crystal emitter and the polycrystal emitter.

The height of the barrier $\Delta\phi_B$ reduces the base current as the barrier of the positive holes injected from the base region. The positive holes injected from the base region, after passing through the tunnel film, are further reduced to $\exp(-\Delta\phi_B/kT)$, and becomes a value of $e^{-1}$ if the height $\Delta\phi_B$ of the above-mentioned barrier is kT. Accordingly, if the height $\Delta\phi_B$ of said barrier is kT or higher which is the heat energy at said temperature T, there ensues the effect of base current reduction.

The height of the barrier $\Delta\phi_B$, in the present invention, is created by the difference in Fermi level between the emitter region of single crystal and the polycrystal region.

Due to such effect, a hetero-junction effect arises in the emitter region, whereby increase of current amplification ration $h_{FE}$ can be effected.

As a problem in designing, the above-mentioned constitution can be realized by making concentration in the n$^+$ emitter region 6 smaller than that in the polycrystal layer 8.

The relationship between the energy $E_i$ and the Fermi level $E_F$ can be represented approximately by the following formula:

n-type semiconductor: $E_F - E_i = kT \ln \dfrac{N_D}{n_i}$ (18)

p-type semiconductor: $E_i - E_F = kT \ln \dfrac{N_A}{n_i}$ (19)

$N_D$ and $N_A$ are respectively n-type, p-type impurity carrier density.

Whereas, the above formula is the range to which Boltzman's statistic is applicable, when the carrier $n_i$ becomes higher concentration, Fermi-Dirac statistic is applied and therefore the above formula cannot be employed.

Figure 23:
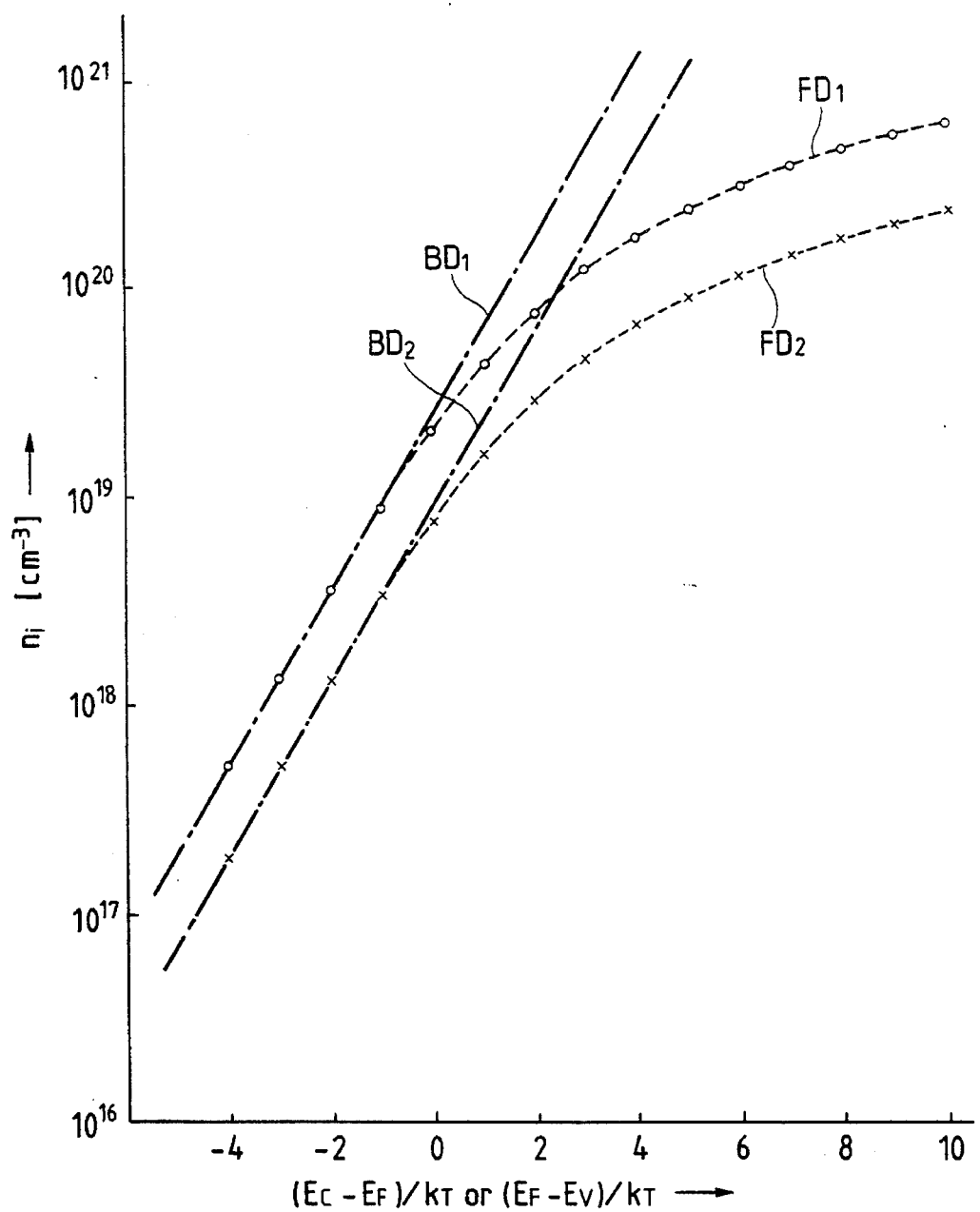
FIG. 23 is a graph showing the relationship of carrier density versus normalized energy in semiconductor silicon.

FIG. 23 shows the relationship between Fermi level $E_F$ and carrier density $n_i$ in semiconductor silicon the axis of abscissa in the same Figure represents energy normalized with kT, namely $(E_F-E_C)/kT$ in the case of n-type semiconductor and $(E_V-E_F)kT$ in the case of p-type semiconductor, respectively, and its axis of ordinate carrier density $n_i$ [cm$^{-3}$]. $n_i$ is a value approximately equal to impurity density at normal temperature.

In the formula showing the above-mentioned axis of abscissa, $E_C$, $E_V$ are respectively energies of the conduction band end, the valence electron band end, and the fact that the normalized energy is zero means that Fermi level $E_F$ is coincides with $E_C$, $E_V$. As compared with such coincidence, if the carrier density $n_i$ is higher, it means that $E_F$ is not in the forbidden band but incorporated into the conduction band in n-type, and into the valence electron band in p-type. The impurity concentration at this time becomes $2.1 \times 10^{19}$ [cm$^{-3}$] in the case of n-type and $8 \times 10^{18}$ [cm$^{-3}$] in the case of p-type.

In FIG. 23, the lines shown by chain lines (curved line $BD_1$, straight line $BD_2$) are examples to which Boltzman's statistic is applied, and the lines shown by broken lines (curved line $FD_1$, straight line $FD_2$) are examples to which Fermi-Dirac statistics is applied, and difference occurs between the statistics in the range where the normalized energy is larger than 1. More specifically, when the normalized energy is larger than 1, Fermi energy cannot be correctly evaluated unless Fermi-Dirac statistic is used. In the same Figure, the plots of the symbol O show the case of n-type semiconductor, and the plots of x the case of p-type semiconductor.

The difference between n-type semiconductor and p-type semiconductor occurs due to difference in band structure, effective mass. Of courts, with other materials, this value will be different.

When the concentration in the vicinity of the emitter base region is defined as $N_{E1}$, and that in the higher concentration polycrystal region as $N_{E2}$, then from the above formula (18), the following relationship is approximately valid:

$N_{E2} \geq eN_{E1}$ where e is a natural number (=2.178). Under this condition, $\Delta\phi_B \geq kT$. Correctly, $N_{E1}$, $N_{E2}$ will be determined by use of the data in FIG. 23.

When the relationship $\Delta\phi_B \geq kT$ is valid, the relationship becomes $N_{E2} \geq e^2 N_{E1}$.

In the present invention, the thickness $W_{EO}$ and the concentration $N_D$ in the emitter region $E_R$ shown in FIG. 22 are also important factors for reducing the base current. In the same Figure, $E_R$ represents emitter region, $B_R$ base region, and $C_R$ collector region.

Ordinarily, the above-mentioned thin film 30 should preferably have a thickness of 20 [Å] or less. Since it is smaller as compared with the thickness of the n$^+$ emitter region 6, the distance $W_E$ from the emitter-base junction to the polycrystal layer 8 is represented by:

$W_E \approx W_{EO} + \delta$ (21), thus becoming substantially equal to $W_{EO}$.

On the other hand, another important factor in the present embodiment, namely inhibition of the minority carriers injected from the base is effected at the interface between the polycrystal layer 8 and the thin film 30. Of course, the tunnel probability of electrons and positive holes in tunnel film is greater for electrons, and therefore the above-mentioned inhibition effect has also occurred simultaneously with said tunnel effect.

Also in the case of the base current of the BFT according to the present embodiment, it becomes primarily the recombination current represented by the above formula (7), and the maximum value $h_{FEmax}$ of current amplification ratio in this case is as follows:

$$h_{FEmax} = 2(L_n/W_B)^2$$

whereby the upper limit of $h_{FE}$ is determined only by the base conditions. $h_{FE}$ according to the present invention is 10,000 or higher.

FIG. 8 shows the relationship between impurity concentration $N_D$ in the above-mentioned $n^+$ emitter region 6 and the diffusion distance $L_P$ of minority carriers (positive holes) and the life $\sigma_P$ of said minority carriers. From this relationship, the emitter depth should be preferably made at least about ⅓ of the diffusion distance of positive holes.

Next, the process for preparation of the semiconductor device of the present embodiment shown in FIG. 1 is described.

(1) On a substrate 1 of a predetermined conduction type (p-type or n-type) is formed on an $n^+$ region 3 with an impurity concentration of $10^{15}$ to $10^{19}$ [cm$^{-3}$] by ion injection (or impurity diffusion, etc.) of As, Sb, P, etc.

(2) By epitaxial technique, etc. an n-type region 3 with an impurity concentration of $10^{14}$ to $10^{17}$ [cm$^{-3}$] is formed.

(3) An n+ region 7 for reducing the resistance of the collector (with an impurity concentration of $10^{17}$ to $10^{20}$ cm$^{-3}$] is formed.

(4) An insulation film 102 for element separation is prepared by the selective oxidation method or the CVD method, etc.

(5) In the active region, a $p^+$ region 5 and a p region 4 which is the base region are formed by the ion injection method, etc.

(6) After opening of an emitter contact on the insulation film 101, an $n^+$ emitter region doped with As, Sb, P, etc. (impurity concentration of $5\times10^{17}$ to $5\times10^{19}$ [cm$^{-3}$] 6 is formed by the ion injection method or the thermal diffusion method.

(7) A thin film 30 is prepared by oxidation at a lower temperature of 500° to 650 [C.°] or by thermal oxidation by rapid thermal acceleration (RTA).

(8) After deposition of a polycrystalline Si doped to $n^+$ according to the LPCVD method, n-type impurity of As or P is introduced by the ion injection method at high concentration ($5\times10^{19}$ [cm$^{-3}$] or higher), and subjected to heat treatment for activation. However, heat treatment is carried out at low temperature (850 [°C.] or lower) so that it will not be diffused to the $n^+$ emitter layer 6 below the polycrystalline silicon layer, or within a short time by rapid thermal heating. Then, the polycrystalline layer 8 is subjected to patterning to form an emitter electrode.

(9) An insulation film 103 is deposited, which is annealed and then subjected to opening of contact.

(10) An Al—Si (1%) which becomes the electrode 200 is subjected to sputtering, followed by patterning of the Al—Si.

(11) After alloy formation of the Al—Si electrode, a passivation film is formed.

According to the procedure as described above, the BPT of the present embodiment is completed.

What is important in the above-described process concerns preparation of the thin film 30 of (7) and setting of the emitter concentrations of (6), (8). The single crystalline emitter in (6) is required to set the depth of junction and the concentration so as to make the base current determined by the above formula (10) minimum.

While shallowing by making the emitter concentration higher is one means, if said concentration becomes $10^{19}$ [cm$^{-3}$] or higher, the band-tailing effect with an impurity occurs to increase minority carriers in proportion to $\exp(\Delta E/kT)$, whereby the base current represented by the above formula (10) begins to increase. When the concentration becomes higher, it becomes difficult to effect a shallow junction also in the preparation process. This is because the impurity diffusion coefficient becomes larger as the impurity concentration is higher.

Therefore, the emitter region which is a single crystal is made to have its concentration of a junction depth in the vicinity of $10^{19}$ [cm$^{-3}$].

On the other hand, the concentration of the polycrystal layer is set at least higher by about one cipher than the emitter region. In the BPT having no tunnel thin film of the prior art, diffusion occurred during heat treatment, thereby making preparation difficult, but in the present embodiment, due to the presence of the ultra thin-film 30, the diffusion speed of the impurity in said thin film is slower by 1 to 2 ciphers as compared with single crystal, thus solving such problem.

On the other hand, diffusion of an impurity with a grain boundary of polycrystal being interposed is faster by 1 to 2 ciphers as compared to single crystal, whereby stable preparation of BPT can be performed.

Other characteristic functions of the above-mentioned thin film 30 are separation of the polycrystal layer 8 from the $n^+$ region 6 which is the single crystal of the emitter region 6, simultaneously with flattening of its interface, and also effecting stabilization of the polycrystal layer 8.

More specifically, when a polycrystal layer 8 is formed on the $n^+$ region 6 which is a mere single crystal, the crystal which has about the size of the polycrystal on the single crystal is epitaxially grown, whereby the interface with inherent single crystal will change to become wavy and a constant shape cannot be always maintained. In this case, if a polycrystal is deposited on the naturally oxidized film and subjected to heat treatment, the oxide film will be partially broken, whereby epitaxial growth occurs locally, or in an extreme case, the naturally oxidized film will become shaped like ball, resulting in recrystallization of the polycrystal into single crystal.

Thus, in the case of all of the prior art structures, the interface between the single crystal and the polycrystal becomes unflat, thereby causing variance of characteristics of BPT.

More specifically, when the carriers injected from the base into emitter are recombined within the emitter, the emitter becomes nonuniform internally, and therefore in the individual BPT prepared, the base current value is not constant, but variance between the respective BPT becomes larger.

In the present invention, the thin film 30 is formed in the $n^+$ region 6 which is a single crystal, and the polycrystal layer 8 is formed on said thin film (silicon oxide film in this embodiment), and therefore its interface is flat on the atomic order. The polycrystal layer 8, which is deposited through the stable thin film 30, is not susceptible to rearrangement of the polycrystal by heat treatment and also stable in the later heat treatment. In microcrystal Si, amorphous Si, etc. of the prior art (deposition temperature 100° to 300 [°C.]), their characterisitics are readily changed by heat treatment at 400° to 600[° C.], whereby deterioration of current amplification ratio $h_{FE}$ will readily occur.

In the present embodiment, because the crystal is a polycrystal, the deposition temperature becomes higher. For example, in polycrystalline Si, the temperature is about 550° to 650 [°C.], the crystal grain size is large, and in addition substantially no hydrogen is contained, and there is little in change of crystal grain size in subsequent steps and also no change by elimination of hydrogen will occur. In the case of the polycrystalline Si, it can stand sufficiently a temperature up to 900 [°C.] to give an extremely stable BPT.

Since the interface of the polycrystal layer 8 exists at the interface with the thin film 30, the interface with the emitter region which is a single crystal is extremely flat. This is an extremely important factor in stabilizing the BPT characteristics.

As the apparent from the above description, the material of the above-described thin film 30 is required to be stable, and therefore as described previously should be desirably chemically stable materials such as $SiO_2$, $Si_3N_4$, SiC, $Al_2O_3$, etc. To add further, the interface between the thin film 30 and the single crystal is also extremely important, and the recombination level of the interface is required to be made low.

Also, by use of SiC, etc., the structure may be made a tunnel type barrier. For example, SiC as compared with Si has a conduction band energy difference $\Delta E_v$=0.53 [eV], a valence electron band difference $\Delta E_c$=0.55 [eV] and a band gap $E_b$–2.2 [eV], thus having a different structure from semiconductor/insulator junction when SiC and Si are both n-types and junctioned stepwise.

As the barrier height $\Delta\phi_B$ of the thin film 30 for tunnel is lower, the direct tunnel probability becomes higher, whereby more current will flow. That is, the emitter resistance is lowered to give a preferable device. As the material for said thin film 30, those which are stable and narrow in forbidden band width are desirable.

Figure 24:
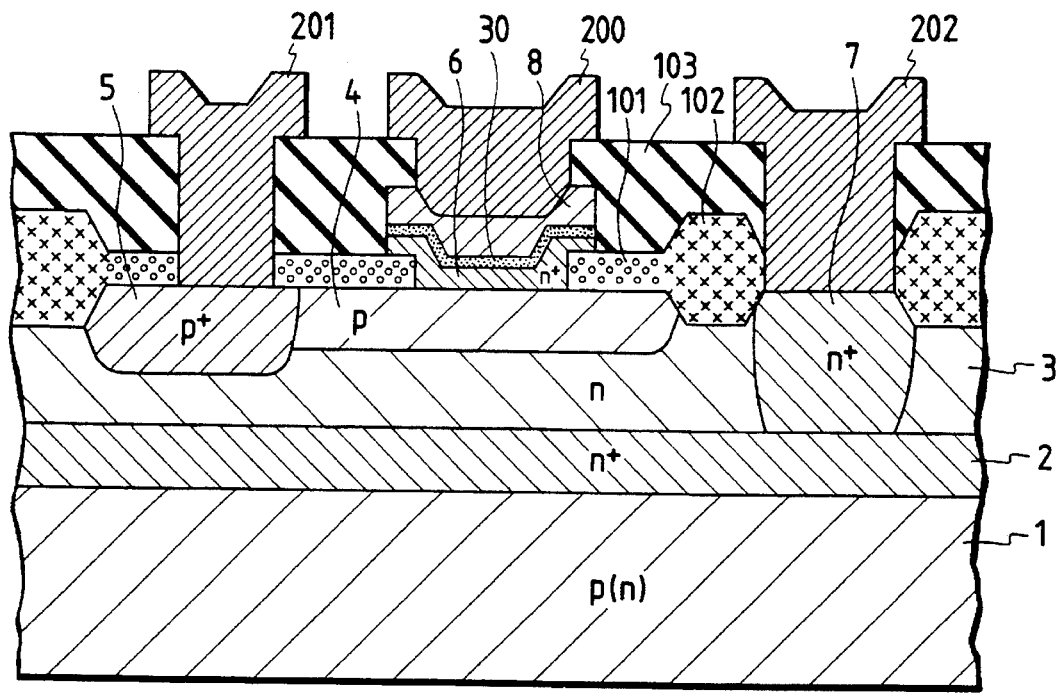
FIG. 24 is a cross-sectional view of a semiconductor device showing the eighth example of the present invention.

Next, FIG. 24 shows a semiconductor device according to the eighth embodiment of the present invention. This embodiment has the emitter region 6 in the above-described first embodiment formed by epitaxial growth, and further a thin film 30 for tunnel and a high concentration polycrystal layer 8 laminated thereabove. With such constitution, the emitter region 6 is in contact in plane with the base region, and most of diffusion or carriers from the emitter region, and most of diffusion of carriers from the emitter region to the base region are inhibited, whereby the lateral direction current in the emitter region is small and the influence by the dimensional precision on current amplification ratio can be reduced. Accordingly, it is useful for application to fine formation of semiconductor devices and a highly integrated photoelectric converting device.

Other constitutions, actions are the same as in the seventh embodiment as described and therefore redundant description is omitted.

Figure 25:
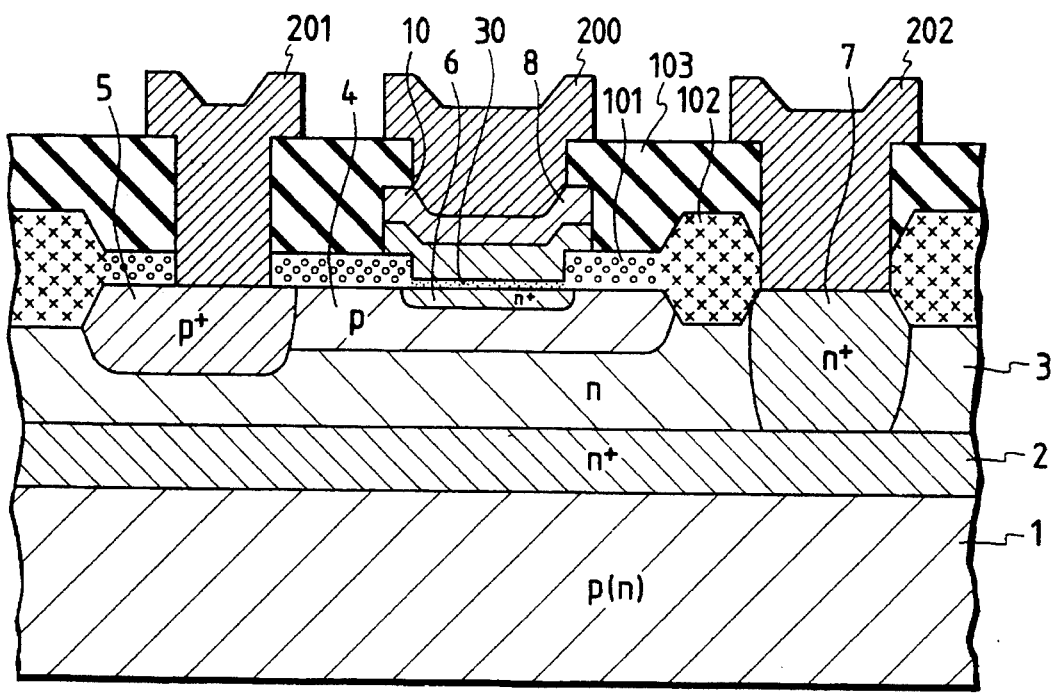
FIG. 25 is a cross-sectional view of a semiconductor device showing the ninth example of the present invention.

FIG. 25 shows the ninth embodiment of the present invention.

In this embodiment, between the high concentration polycrystal layer 8 and the electrode 200 in the seventh embodiment, a so-called barrier metal layer 10 of TiN, TiW, Mo, W, etc. which acts as the diffusion barrier is formed to inhibit the reaction between the polycrystal and the electrode (A1), whereby a semiconductor which is stable and little in variance can be prepared. Since the electrode (A1) is susceptible to diffusion within the polycrystal, it may have influences on the characteristics of BPT is some cases.

Other constitutions and actions are the same as in the above-described first embodiment, and therefore redundant description is omitted.

The BPT's according to the first to the ninth embodiments as described above were found to have extremely stable transistor characterisitics.

The fourth to ninth embodiments as described above can be applied to the transistors to be used for the sensor portion of the electronic device as shown in FIG. 16 similarly as the first to the third embodiments, as a matter of course.

I claim:

1. A semiconductor device comprising:

a collector region of first conductivity type;

a base region of second conductivity type;

an emitter region of the first conductivity type;

a thin film provided on said emitter region in which tunnel current for both electron and hole carriers can flow; and a polycrystalline layer laminated on said thin film;

wherein, between said emitter region and said polycrystalline layer a Fermi level of said polycrystalline layer and a Fermi level of said emitter region are aligned so as to form a potential barrier against a carrier injected from said base region into said emitter region.

2. A semiconductor device according to claim 1, wherein said emitter region has a thickness not greater than a diffusion length of a minority carrier injected from said base region.

3. A semiconductor device according to claim 2, wherein the Fermi level of said polycrystalline layer changes according to a quantum effect.

4. A semiconductor device according to claim 2, wherein said semiconductor layer has grains of size not greater than 300 Å, at least, in a vicinity of a boundary with a tunnel film.

5. A semiconductor device according to claim 1, wherein said polycrystalline layer has an impurity concentration of N, grain size of L, and trap level density $Q_t$ at a grain boundary; wherein they satisfy a relationship $N > Q_t/L$.

6. A semiconductor device according to claim 2, wherein said thin film has a thickness not greater than 10 Å.

7. A semiconductor device according to claim 2, wherein said thin film is formed from $SiO_2$, $Si_3N_4$, SiC, or $Al_2O_3$.

8. A semiconductor device according to claim 2, wherein a further layer having a greater grain size is formed on said polycrystalline layer.

9. A semiconductor device according to claim 2, wherein said emitter region is epitaxially grown on said base.

10. An electronic apparatus including a semiconductor device which functions as a photoelectric conversion device, said photoelectric conversion device comprising:

a collector region of first conductivity type;

a base region of second conductivity type;

an emitter region of the first conductivity type;

a thin film provided on said emitter region in which tunnel current for both electron and hole carriers can flow; and a polycrystalline layer laminated on said thin film;

wherein, between said emitter region and said polycrystalline region, a Fermi level of said polycrystalline layer and a Fermi level of said emitter region are aligned so as to form a potential barrier against a carrier injected from said base region into said emitter region.

* * * * *

UNITED STATES PATENT AND TRADEMARK OFFICE
CERTIFICATE OF CORRECTION

PATENT NO. : 5,486,704
DATED : January 23, 1996
INVENTOR(S) : MASAKAZU MORISHITA          Page 1 of 3

It is certified that error appears in the above-identified patent and that said Letters Patent is hereby corrected as shown below:

On the title page,

AT [57] ABSTRACT

Line 2, "devive comprises;" should read
--device comprises:--.

COLUMN 3

Line 5, "region.," should read --region,--.

COLUMN 9

Line 24, "$\alpha=[\dfrac{2m^*(\phi_{Bh}+E)}{}]\ 1/2 \qquad (4)$" should read

--$\alpha=[\dfrac{2m^*(\phi_{Bh}+E)}{\hbar^2}]\ 1/2$ --.

Line 49, "(cP'" should read --(c)'--.

COLUMN 10

Line 11, "$\beta \approx (1m^*\phi_B)^{\frac{1}{2}}/\hbar \qquad (4)$" should read
--$\beta \approx (2m^*\phi_B)^{\frac{1}{2}}/\hbar \qquad (4)$--.

COLUMN 11

Line 60, "$(W_E/L_p)2$-fold." should read
--$(W_E/L_p)^2$-fold.--.

UNITED STATES PATENT AND TRADEMARK OFFICE
CERTIFICATE OF CORRECTION

PATENT NO. : 5,486,704
DATED : January 23, 1996
INVENTOR(S) : MASAKAZU MORISHITA Page 2 of 3

It is certified that error appears in the above-identified patent and that said Letters Patent is hereby corrected as shown below:

COLUMN 12

Line 44, "method;" should read --method,--.
Line 64, "as" (second occurrence) should read --an--.

COLUMN 14

Line 46, "not" should read --now--.

COLUMN 15

Line 19, "($E_{11}$," should read --($E_{111}$,--.

COLUMN 17

Line 35, "region" should read --region 2--.

COLUMN 19

Line 66, "impurity carrier" should read
--impurity densities, and $n_i$
intrinsic semiconductor carrier--.

COLUMN 20

Line 6, "silicon the" should read --silicon. The--.
Line 37, "courts," should read --course,--.

UNITED STATES PATENT AND TRADEMARK OFFICE
CERTIFICATE OF CORRECTION

PATENT NO. : 5,486,704
DATED : January 23, 1996
INVENTOR(S) : MASAKAZU MORISHITA It is certified that error appears in the above-identified patent and that said Letters Patent is hereby corrected as shown below:

COLUMN 21

Line 18, "$\sigma p$" should read --$Tp$--.
Line 31, "(with" should read --with--.
Line 32, "$cm^{-3}]$" should read --$[cm^{-3}]$--.

COLUMN 24

Line 20, "layer" (first occurrence) should read --layer,--.
Line 38, "boundary;" should read --boundary,--.

Signed and Sealed this

Twenty-third Day of July, 1996

Attest:

BRUCE LEHMAN

Attesting Officer           Commissioner of Patents and Trademarks